US010549458B2

(12) United States Patent
Nakahara et al.

(10) Patent No.: US 10,549,458 B2
(45) Date of Patent: Feb. 4, 2020

(54) MOLD, METHOD FOR PRODUCING MOLD, ANTI-REFLECTION FILM AND METHOD FOR PRODUCING ANTI-REFLECTION FILM

(71) Applicant: Sharp Kabushiki Kaisha, Sakai, Osaka (JP)

(72) Inventors: Takahiro Nakahara, Sakai (JP); Miho Yamada, Sakai (JP); Kiyoshi Minoura, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 494 days.

(21) Appl. No.: 15/303,049

(22) PCT Filed: Apr. 9, 2015

(86) PCT No.: PCT/JP2015/061119
§ 371 (c)(1),
(2) Date: Oct. 10, 2016

(87) PCT Pub. No.: WO2015/159797
PCT Pub. Date: Oct. 22, 2015

(65) Prior Publication Data
US 2017/0028591 A1    Feb. 2, 2017

(30) Foreign Application Priority Data

Apr. 14, 2014  (JP) .................................. 2014-083171
Nov. 21, 2014  (JP) .................................. 2014-237161

(51) Int. Cl.
*B29C 33/38*       (2006.01)
*B29C 59/04*       (2006.01)
(Continued)

(52) U.S. Cl.
CPC ...... *B29C 33/3842* (2013.01); *B29C 33/3828* (2013.01); *B29C 33/424* (2013.01);
(Continued)

(58) Field of Classification Search
CPC ... B29C 33/3842; B29C 33/56; B29C 33/424; C25D 11/24; C25D 11/12; C25D 11/16; C25D 11/04; C23F 1/36; C23F 1/20
See application file for complete search history.

(56) References Cited

U.S. PATENT DOCUMENTS 3,448,055 A * 6/1969 Mickelson ............. C23G 1/125
                                            134/3
5,382,295 A * 1/1995 Aoki ..................... C23G 1/22
                                            134/2
(Continued)

FOREIGN PATENT DOCUMENTS

JP       2001-517319 A      10/2001
JP       2003-531962 A      10/2003
(Continued)

OTHER PUBLICATIONS

International Search Report PCT/ISA/210 for International Application No. PCT/JP2015/061119 dated Jul. 2, 2015.

*Primary Examiner* — Duy Vu N Deo
(74) *Attorney, Agent, or Firm* — Harness, Dickey & Pierce, P.L.C.

(57) ABSTRACT

A manufacturing method of a mold includes the steps of: providing an aluminum base in the shape of a hollow cylinder which is made of a Al—Mg—Si based aluminum alloy, the aluminum base being mechanically mirror-finished; performing a frosting treatment on a surface of the aluminum base with an aqueous solution which contains a salt of hydrogen fluoride and ammonium; thereafter, forming an inorganic material layer on the surface of the aluminum base and forming an aluminum film on the inorganic material layer, thereby forming a mold base; and alternately repeating anodization and etching on a surface of the alu- (Continued)

minum film of the mold base, thereby forming an inverted moth-eye structure which has a plurality of micro recessed portions.

24 Claims, 18 Drawing Sheets

(51) Int. Cl.
| | |
|---|---|
| *C25D 11/04* | (2006.01) |
| *B29C 33/42* | (2006.01) |
| *B29C 33/60* | (2006.01) |
| *B29C 33/76* | (2006.01) |
| *B29C 35/08* | (2006.01) |
| *C23C 14/18* | (2006.01) |
| *C23F 1/36* | (2006.01) |
| *B29K 33/00* | (2006.01) |
| *B29K 105/20* | (2006.01) |
| *B29K 667/00* | (2006.01) |

(52) U.S. Cl.
CPC .............. *B29C 33/60* (2013.01); *B29C 33/76* (2013.01); *B29C 35/0805* (2013.01); *B29C 59/046* (2013.01); *C23C 14/185* (2013.01); *C23F 1/36* (2013.01); *C25D 11/04* (2013.01); *B29C 2033/426* (2013.01); *B29C 2035/0827* (2013.01); *B29K 2033/08* (2013.01); *B29K 2105/20* (2013.01); *B29K 2667/003* (2013.01); *B29K 2905/02* (2013.01); *B29K 2995/0018* (2013.01)

(56) References Cited

U.S. PATENT DOCUMENTS

| | | | |
|---|---|---|---|
| 6,359,735 | B1 | 3/2002 | Gombert et al. |
| 2003/0205475 | A1 | 11/2003 | Sawitowski |
| 2007/0159698 | A1 | 7/2007 | Taguchi et al. |
| 2012/0043297 | A1 | 2/2012 | Fujii et al. |
| 2012/0213971 | A1 | 8/2012 | Ihara |
| 2012/0318772 | A1* | 12/2012 | Minoura ................ C25D 11/12 216/52 |
| 2013/0004612 | A1 | 1/2013 | Isurugi et al. |
| 2014/0230974 | A1* | 8/2014 | Lin .......................... C22F 1/047 148/695 |
| 2015/0140154 | A1 | 5/2015 | Isurugi et al. |
| 2015/0321386 | A1 | 11/2015 | Hayashi |

FOREIGN PATENT DOCUMENTS

| | | |
|---|---|---|
| JP | 2013-147583 A | 8/2013 |
| WO | WO-2006/059686 A1 | 6/2006 |
| WO | WO-2010/125795 A1 | 11/2010 |
| WO | WO-2011/055757 A1 | 5/2011 |
| WO | WO-2011/105206 A1 | 9/2011 |
| WO | WO-2011/125486 A1 | 10/2011 |
| WO | WO-2013/146656 A1 | 10/2013 |
| WO | WO-2013/183576 A1 | 12/2013 |

* cited by examiner (a)

(b)

(c)

(d)

(a)

(b)

(c)

(d)

(a)

(b)

(a)

(b)

(a)

(b)

(a)

(b)

(c)

(a)

(b)

(a)

(b)

(c)

(d)

(a)

(b)

(a)

(b)

(a)

(b)

(c)

MOLD, METHOD FOR PRODUCING MOLD, ANTI-REFLECTION FILM AND METHOD FOR PRODUCING ANTI-REFLECTION FILM

TECHNICAL FIELD

The present invention relates to a mold, a mold manufacturing method, an antireflection film produced using the mold, and an antireflection film production method. In this specification, the "mold" includes molds that are for use in various processing methods (stamping and casting), and is sometimes referred to as a stamper. The "mold" can also be used for printing (including nanoimprinting).

BACKGROUND ART

Display devices for use in TVs, cell phones, etc., and optical elements, such as camera lenses, etc., usually adopt an Antireflection technique in order to reduce the surface reflection and increase the amount f light transmitted therethrough. This is because, when light is transmitted through the interface between media of different refractive indices, e.g., when light is incident on the interface between air and glass, the amount of transmitted light decreases due to, for example, Fresnel reflection, thus deteriorating the visibility.

An antireflection technique which has been receiving attention in recent years is forming over a substrate surface a microscopic uneven pattern in which the interval of recessed portions or raised portions is not more than the wavelength of visible light ($\lambda$=380 nm to 780 nm). See Patent Documents 1 to 3. The two-dimensional size of a raised portion of an uneven pattern which performs an antireflection function is not less than 10 nm and less than 500 nm. Here, the "two-dimensional size" of the raised portions refers to the area equivalent circle diameter of the raised portions viewed in a direction normal to the surface. For example, when the raised portions have a conical shape, the two size of the raised portions is equivalent to the diameter of the base of the cone. The same applies to the "two-dimensional size" of the recessed portions.

This method utilizes the principles of a so-called moth-eye structure. The refractive index for light that is incident on the substrate is continuously changed along the depth direction of the recessed portions or raised portions, from the refractive index of a medium on which the light is incident to the refractive index of the substrate, whereby reflection of a wavelength band that is subject to antireflection is prevented.

The moth-eye structure is advantageous in that it is capable of performing an antireflection function with small incident angle dependence over a wide wavelength band, as well as that it is applicable to a number of materials, and that an uneven pattern can be directly formed in a substrate. As such, a high-performance antireflection film (or antireflection surface) can be provided at a low cost.

The present applicant has developed a method of producing an antireflection film (or antireflection surface) which has a moth-eye structure with the use of an anodized porous alumina layer obtained by anodization of aluminum (Patent Documents 2 and 3).

Utilizing an anodized porous aluminum film can facilitate the manufacture of a mold which is used for formation of a moth-eye structure over a surface (hereinafter, "moth-eye mold"). In particular, as described in Patent Documents 2 and 3, when the surface of the anodized aluminum film as formed is used as a mold without any modification, a large effect of reducing the manufacturing cost is achieved. The structure of the surface of a moth-eye mold which is capable of forming a moth-eye structure is herein referred to as "inverted moth-eye structure".

As described in Patent Documents 1 to 4, by providing an uneven structure (macro structure) which is greater than a moth-eye structure (micro structure) in addition to the moth-eye structure, the antireflection film (antireflection surface) can be provided with an antiglare function. The two-dimensional size of a raised portion or a recessed portion of the uneven structure which is capable of performing the antiglare function (sometimes referred to as "antiglare structure") is not less than 200 nm and less than 100 µm. The structure of the surface of a mold which is capable of forming the antiglare structure is referred to as "inverted antiglare structure". The entire disclosures of Patent Documents 1 to 4 are incorporated by reference in this specification.

In this specification, an uneven structure which forms the moth-eye structure (or inverted moth-eye structure) is referred to as "micro uneven structure", and an uneven structure which forms the antiglare structure (or inverted antiglare structure) is referred to as "macro uneven structure". The extent of the two-dimensional size of the macro uneven structure partially overlaps the extent of the two-dimensional size of the micro uneven structure antireflection film (artireflection surface) which has an antiglare function, the uneven structure that forms the antiglare structure is greater than the uneven structure that forms the moth-eye structure that performs an antireflection function.

CITATION LIST

Patent Literature

Patent Document 1: Japanese PCT National Phase Laid-Open Publication No. 2001-517319
Patent Document 2: Japanese PCT National Phase Laid-Open Publication No. 2003-531962
Patent Document 3: NO 2011/055757
Patent Document 4: NO 2013/146656

SUMMARY OF INVENTION

Technical Problem

However, it cannot be said that a method for efficiently manufacturing a mold that is for production of an antireflection film (or antireflection surface) which has an appropriate antiglare function has been established.

For example, it is difficult for the sandblast method disclosed in Patent Document 1 to form a desired macro uneven structure which performs an antiglare function with high reproducibility. The cathode electrolysis method disclosed in Patent Document 3 sometimes fails to form a macro uneven structure which is capable of sufficiently performing an antiglare function.

A surface in which a continuous macro uneven structure which has no flat portion in a resin layer formed electrodeposition disclosed in Patent Document 4 is reflected disadvantageously leads to blurted images. In recent years, as display devices have higher definition, there are greater demands for antireflection films which have an appropriate antiglare function with suppressed blur in images.

Objects of the present invention include providing an antireflection film (or antireflection surface) which has an appropriate antiglare function and appropriate specular reflectivity, providing a method for producing such an antireflection film, providing a mold for production of such an antireflection film, and providing a method which is capable of efficiently manufacturing such a mold.

Solution to Problem

A mold manufacturing method according to an embodiment of the present invention includes: (a) providing an aluminum base in the shape of a hollow cylinder which is made of a Al—Mg—Si based aluminum alloy, the aluminum base being mechanically mirror-finished; (b) performing a frosting treatment on a surface of the aluminum base with an aqueous solution which contains a salt of hydrogen fluoride and ammonium; (c) after step (b), forming an inorganic material layer on the surface of the aluminum base and forming an aluminum film on the inorganic material layer, thereby forming a mold base; (d) after step (c), anodizing a surface of the aluminum film, thereby forming a porous alumina layer which has a plurality of micro recessed portions; (e) after step (d), bringing the porous alumina layer into contact with an etchant, thereby enlarging the plurality of micro recessed portions of the porous alumina layer; and (f) after step (e), further performing anodization to grow the plurality of micro recessed portions.

In one embodiment, the aluminum base is a cold-drawn aluminum base. The aluminum base is an aluminum base formed by hot extrusion. The hot extrusion may be mandrel extrusion or may be porthole extrusion. The cold drawing can be omitted. When the cold drawing is not performed, using an aluminum base formed by mandrel extrusion is preferred.

In one embodiment, the mold manufacturing method further includes, before step (b), a degreasing step and a water washing step.

In one embodiment, step (b) is performed within 15 minutes after the water washing step is finished.

In one embodiment, the mold manufacturing method further includes, before step (b), a base surface etching step of etching the surface of the aluminum base using an alkaline etchant.

In one embodiment, the base surface etching step also serves as the degreasing step.

In one embodiment, the alkaline etchant contains an inorganic or organic base in a proportion of not less than 0.03 mass %.

In one embodiment, a pH of the alkaline etchant is not less than 10 and not more than 12.

In one embodiment, the alkaline etchant contains potassium hydroxide.

In one embodiment, the alkaline etchant contains an organic compound which has an amino group.

In one embodiment, the base surface etching step and step (b) make an arithmetic mean roughness Ra of the surface of the aluminum base be not less than 50 nm and not more than 300 nm.

In one embodiment, in the base surface etching step, a portion of at least 1.4 μm from a surface of the aluminum base is removed.

In one embodiment, the mold manufacturing method further includes, before step (b), anodization step and an etching step for pretreatment.

In one embodiment, in the anodization step for the pretreatment, an electrolytic solution used is a sulfuric aqueous solution.

In one embodiment, in the etching step for the pretreatment, an etchant used is a phosphoric aqueous solution.

In one embodiment, in step (b), the salt of hydrogen fluoride and ammonium is ammonium hydrogen fluoride. In one embodiment, the aqueous solution which contains the salt of hydrogen fluoride and ammonium contains ammonium hydrogen fluoride in a proportion of not less than 4 mass %. Step (b) is performed at, for example, about 10° C. In this case, the duration of the frosting treatment is preferably in a range of not less than 2 minutes and 30 seconds and not more than 8 minutes.

A mold according to an embodiment of the present invention is a mold manufactured according to any of the above-described mold manufacturing methods.

A mold according to another embodiment of the present invention includes a porous alumina layer, the porous alumina layer having a surface structure which includes a plurality of raised portions whose two-dimensional size when viewed in a direction normal to a surface is not less than 200 nm and not more than 30 μm and a plurality of micro recessed portions whose two-dimensional size when viewed in a direction normal to a surface is not less than 10 nm and less than 500 nm.

An antireflection film production method according to an embodiment of the present invention includes the steps of: providing any of the above-described molds; providing a work; irradiating a photocurable resin applied between the mold and a surface of the work with light, thereby curing the photocurable resin; and peeling the mold off from an antireflection film formed of the cured photocurable resin.

An antireflection film according to an embodiment of the present invention is an antireflection film produced according to the above-described antireflection film production method.

An antireflection film according to another embodiment of the present invention has a surface structure which includes a plurality of recessed portions whose two-dimensional size when viewed in a direction normal to a surface is not less than 200 nm and not more than 30 μm and a plurality of micro raised portions whose two-dimensional size when viewed in a direction normal to a surface is not less than 10 nm and less than 500 nm, wherein a point at which a slope of a light distribution curve discontinuously varies is present within a range of light receiving angles of more than 0° and not more than 10° and within a range of relative diffuse reflectances of not less than 1% and not more than 10%, the light distribution curve being plotted on conditions that an incidence angle is 5°, a horizontal axis represents a light receiving angle, and a vertical axis represents a common logarithm of a relative diffuse reflectance (%) which is normalized with a maximum of a diffuse reflected light intensity being 80%.

In one embodiment, a haze value of the antireflection film is not less than about 7 and not more than about 24.

Advantageous Effects of Invention

According to an embodiment of the present invention, a mold for production of an antireflection film (or antireflection surface) which has an appropriate antiglare function and appropriate specular reflectivity and a method which is capable of efficiently manufacturing such a mold are provided. A mold according to an embodiment of the present invention is capable of producing an antireflection film (antireflection surface) which has an appropriate antiglare function, appropriate specular reflectivity, and an excellent antireflection function. An antireflection film according to an embodiment of the present invention has a surface structure which provides an appropriate antiglare function, appropriate specular reflectivity, and an excellent antireflection function.

DESCRIPTION OF EMBODIMENTS

Hereinafter, a mold and a mold manufacturing method according to an embodiment of the present invention are described with reference to the drawings.

Figure 16:
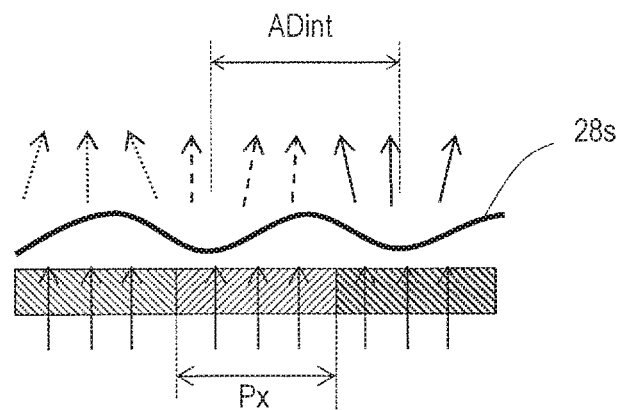
FIGS. 16 (a) and (b) are diagrams schematically illustrating the relationship between the size of the macro uneven structure for formation of a conventional antiglare structure and the dot pitch in the row direction, Ox.
Figure 16:
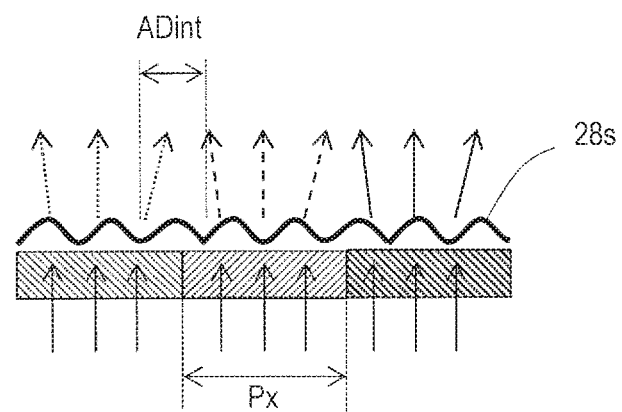

First, the relationship between the size of a macro uneven structure which forms a conventional antiglare structure and the dot pitch in the row direction, Px, is described with reference to FIG. 16, FIGS. 16(a) and 16(b) are diagrams schematically illustrating the relationship between the size of the macro uneven structure which forms a conventional antiglare structure and the dot pitch in the row direction, Px. FIG. 16(a) shows a case where the macro uneven structure greater than the dot pitch Pw. FIG. 16(*b*) shows a case where the macro uneven structure is smaller than the dot pitch Px. Here, the dot refers to respective dots of R, G and B which form a pixel in a typical color liquid crystal display panel. That is, when one of the pixels in the color liquid crystal display panel consists of three dots aligned in the row direction (R dot, G dot and B dot), the pixel pitch in the row direction is three times the dot pitch in the row direction, Px. Note that the pixel pitch in the column direction is equal to the dot pitch in the column direction, Py.

As schematically shown in FIGS. 16(*a*) and 16(*b*), a surface 28*s* which has the macro uneven structure which forms a conventional antiglare structure has a continuous wave-like surface shape which has no flat portion. The macro uneven structure that has such a continuous wave-like surface shape is characterized by the average of the distances between adjoining macro recessed portions (average adjoining distance $AD_{int}$) or the two-dimensional size of recessed portions, $AD_p$. Although macro recessed portions are herein considered, the macro uneven structure can be characterized even when raised portions are considered.

As shown in FIG. 16(*a*), when the average adjoining distance of recessed portions, $AD_{int}$ (which is assumed to be equal to the two-dimensional size of recessed portions, $AD_p$) is for example greater than the row direction dot pitch Px (the pixel pitch in the row direction is three times the dot pitch when one pixel consists of three dots (R, G, B)), a sufficient antiglare function cannot be achieved. To sufficiently achieve the antiglare function, it is preferred that, as shown in FIG. 16(*b*), the average adjoining distance $AD_{int}$ of recessed portions (the two-dimensional size $AD_p$ of recessed portions) is mutually approximately equal and is smaller than the dot pitch. Note that the two-dimensional size of recessed portions refer to a two-dimensional extent viewed in a direction normal to the surface. The recessed portions typically have a conical shape and have a generally circular shape when viewed in a direction normal to the surface. In this case, the two-dimensional size corresponds to the diameter of the circle. When the raised portions are formed with sufficiently high density, the average adjoining distance of two mutually-adjoining recessed portions, $AD_{int}$, is generally equal to the two-dimensional size of recessed portions, $AD_p$. The pixel pitch in a display of a relatively-low definition, for example, a 100 ppi display, is 254 μm. The average adjoining distance $AD_{int}$ in an antireflection film used in this display is preferably not more than about 85 μm (254/3).

A manufacturing method of an antireflection film in which a moth-eye structure is superposed over an antiglare structure which has such a continuous wave-like surface 28*s* that has no flat portion is disclosed in, for example, Patent Document 4. A manufacturing method of a moth-eye mold that is for formation of an antireflection film which has an antiglare function, which is disclosed in Patent Document 4 is described with reference to FIG. 17.

Figure 17:
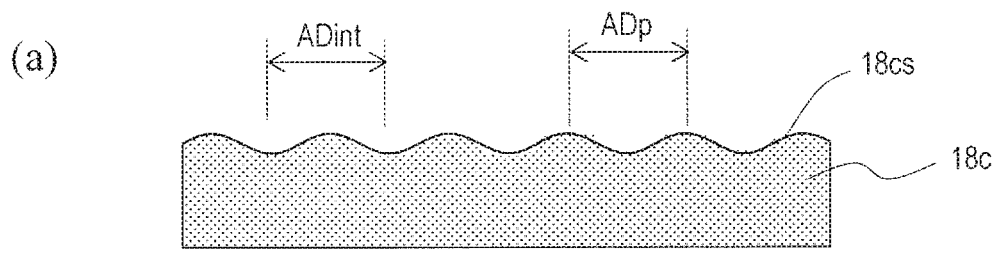
FIG. 17 (a) is a cross-sectional view schematically showing the configuration of the macro uneven structure for formation of a conventional antiglare structure. (b) is a schematic cross-sectional view showing an inverted moth-eye structure superposed over the macro uneven structure. (c) is an enlarged schematic cross-sectional view of the inverted moth-eye structure.
Figure 17:
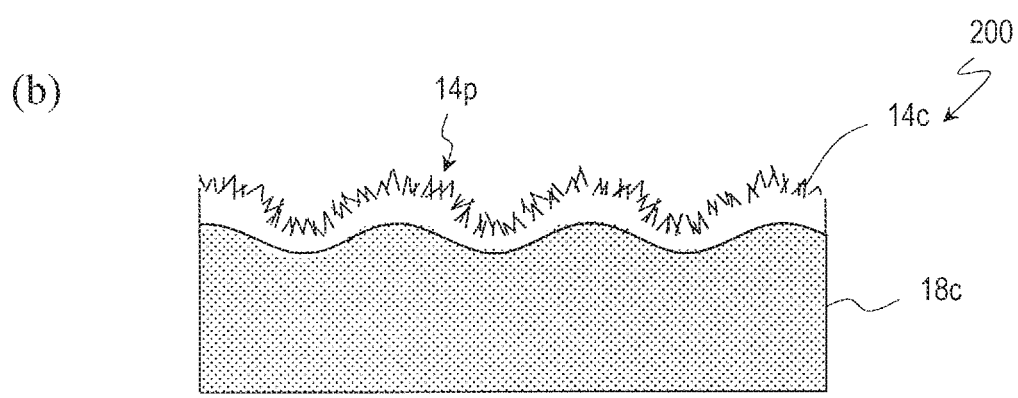
Figure 17:
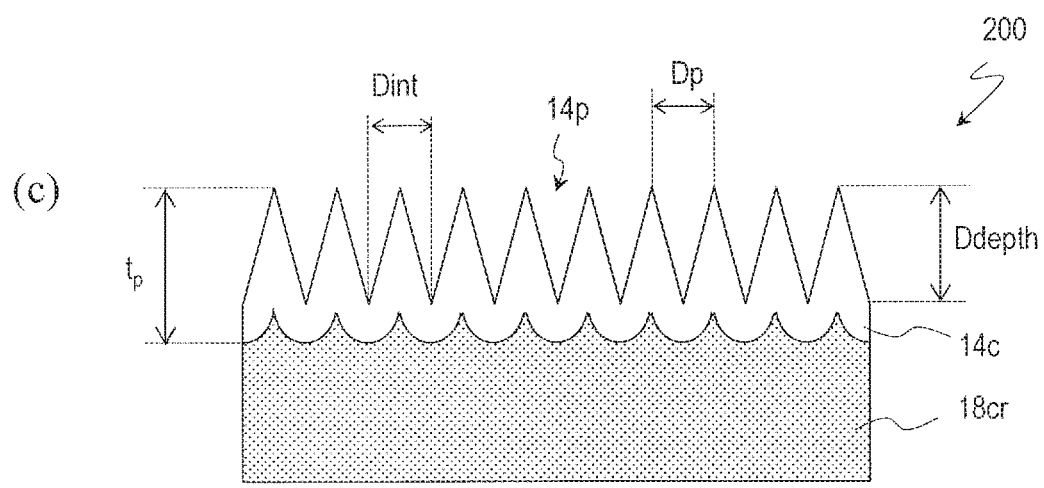

FIG. 17(*a*) is a cross-sectional view schematically showing an inverted antiglare structure for formation of an antiglare structure. FIG. 17(*b*) is a schematic cross-sectional view showing an inverted moth-eye structure superposed over the inverted antiglare structure. FIG. 17(*c*) is an enlarged schematic cross-sectional view of the inverted moth-eye structure.

A surface 18*cs* shown in FIG. 17(*a*) which has an inverted antiglare structure, and which is for formation of an antiglare structure which has the above-described continuous wave-like surface 28*s* that has no flat portion, is obtained by forming an insulator layer of an electrodeposition resin which contains a matting agent over the outer perimeter surface of a metal base which is in the form of a hollow cylinder and forming an aluminum film 18*c* over the insulator layer. That is, the surface of the insulator layer that is formed of an electrodeposition resin which contains a matting agent has a continuous wave-like surface shape which has no flat portion. The surface 18*cs* of the aluminum film 18*c* formed over the insulator layer, in which the shape of the surface of the insulator layer is reflected, has a continuous wave-like surface shape which has no flat portion. Note that the shape of the surface 18*cs* of the aluminum film 18*c* forms the inverted antiglare structure, and therefore, the macro uneven structure of the surface 18*cs* of the aluminum film 18*c* is inverse to the macro uneven structure of the surface 28*s* that forms the antiglare structure.

Next, anodization and etching are repeatedly performed on the surface of the aluminum film 18*c* which has the inverted antiglare structure, whereby an anodized porous alumina layer 14*c* which has micro recessed portions 14*p* is formed as shown in FIG. 17(*b*). In this way, a moth-eye mold 200 is obtained which has a surface at which the inverted moth-eye structure is superposed over the inverted antiglare structure.

Over the porous alumina layer 14*c*, the micro recessed portions 14*p* are in a closely packed arrangement as schematically shown in FIG. 17(*c*). The micro recessed portions 14*p* have a generally conical shape and may have a stepped lateral surface. It is preferred that the two-dimensional size of the micro recessed portions 14*p* (opening diameter: $D_p$) is not less than 10 am and less than 500 nm, and the depth of the micro recessed portions 14*p* ($D_{depth}$) is generally not less than 10 nm and less than 1000 nm (1 μm). It is also preferred that the bottom portion of the micro recessed portions 14*p* is tapered (with the deepest part of the bottom portion being pointed). Further, it is preferred that the micro recessed portions 14*p* are in a closely packed arrangement. Assuming that the shape of the micro recessed portions 14*p* when viewed in a direction normal to the porous alumina layer 14*c* is a circle, it is preferred that adjacent circles overlap each other, and a saddle portion is formed between adjacent ones of the micro recessed portions 14*p*. Note that, when the generally-conical minute recessed portions 22 adjoin one another so as to form saddle portions, the two-dimensional size of the micro recessed portions 14*p*, $D_p$, is equal to the average adjoining distance $D_{int}$. Thus, the porous alumina layer 14*c* of the moth-eye mold that is for production of the antireflection film preferably has a configuration in which the micro recessed portions 14*p* are in an irregular closely-packed arrangement, the micro recessed portions 14*p* having such dimensions that $D_p=D_{int}$ is not less than 10 nm and less than 500 nm and $D_{depth}$ is generally not less than 10 nm and less than 1000 nm (1 μm). The arrangement of the micro recessed portions does not need to be absolutely at random but only needs to be at random to such an extent that interference and diffraction of light do not substantially occur. Note that, strictly speaking, the shape of the openings of the micro recessed portions 14*p* is not a circle. $D_p$ is preferably determine (from the SEM image of the surface. The thickness of the porous alumina layer 14*c*, $t_p$, is not more than about 1 μm. The above description of the inverted moth-eye structure of the porous alumina layer 14*c* also applies to a moth-eye mold of an embodiment of the present invention.

An antireflection film produced with the use of a mold which is manufactured by the mold manufacturing method disclosed in Patent Document 4 disadvantageously causes blurred images (as will be described later with reference to FIG. 10B). This is because the inverted antiglare structure of the mold manufactured by the method disclosed in. Patent Document 4 has relatively large $AD_{int}$ and $AD_p$. Therefore, it is difficult for the manufacturing method disclosed in Patent Document 4 to form an antiglare structure which is suitably used for high-definition displays of, for example, higher than 300 ppi.

According to an embodiment of the present invention which will be described below, an antireflection film (or antireflection surface) is provided which has an antiglare structure, which has an appropriate antiglare function (e.g., the haze value is not less than about 7 and not more than about 24) and appropriate specular reflectivity, and a moth-eye structure which produces an excellent antireflection effect. Further, according to an embodiment of the present invention, a mold for production of such an antireflection film is provided, and furthermore, a method for efficiently manufacturing such a mold is provided. Note that a mold manufactured by a mold manufacturing method according to an embodiment of the present invention is not limited to examples described herein but can be used for production of an antireflection film which has diffuse reflectivity of a small haze value (e.g., not less than about 1 and not more than about 5).

First, a mold manufacturing method according to an embodiment of the present invention and the configuration of mold manufactured by such a manufacturing method are described with reference to FIG. 1 to FIG. 4.

FIGS. 1(a) to 1(d) are schematic cross-sectional views for illustrating a manufacturing method of a moth-eye mold 100 according to an embodiment of the present invention. FIG. 2 is a flowchart illustrating the manufacturing method of the moth-eye mold 100 according to an embodiment of the present invention.

The manufacturing method of the moth-eye mold 100 according to an embodiment of the present invention includes the following steps (a) to (f) as shown in FIG. 2:

(a) providing an aluminum base in the shape of a hollow cylinder which is made of a Al—Mg—Si based aluminum alloy, the aluminum base being mechanically mirror-finished;

(b) performing a frosting treatment on a surface of the aluminum base with an aqueous solution which contains the salt of hydrogen fluoride and ammonium;

(c) after step (b), forming an inorganic material layer on the surface of the aluminum base and forming an aluminum film on the inorganic material layer, thereby forming a mold base;

(d) after step (c), anodizing a surface of the aluminum film, thereby forming a porous alumina layer which has a plurality of micro recessed portions;

(e) after step (d), bringing the porous alumina layer into contact with an etchant, thereby enlarging the plurality of micro recessed portions of the porous alumina layer; and (f) after step (e), performing another anodization, thereby growing the plurality of micro recessed portions.

In this specification, the mold base refers to an object the anodization and the etching in the mold manufacturing process. The aluminum base refers to aluminum in bulk which is self-supporting.

Next, refer to FIGS. 1(a) to 1(d). FIG. 1(a) is a schematic cross sectional view of an aluminum base 12 of the moth-eye mold 100. FIG. 1(b) is cross-sectional view schematically showing the surface structure of the aluminum base 12 which has an inverted antiglare structure. FIG. 1(c) is a schematic cross-sectional view of a mold base 10 in which an inorganic material layer 16 and an aluminum film 18 are provided over the surface of the aluminum base 12. FIG. 1(d) is a schematic cross-sectional view of the moth-eye mold 100 which has an inverted antiglare structure and an inverted moth-eye structure superposed over the inverted antiglare structure.

Figure 1:
FIG. 1 (a) to (d) are schematic cross-sectional views for illustrating a manufacturing method of a moth-eye mold 100 according to an embodiment of the present invention. (a) is a schematic cross-sectional view of an aluminum base 12 of the moth-eye mold 100. (b) is a cross-sectional view schematically showing the surface structure of the aluminum base 12 which has an inverted antiglare structure. (c) is a schematic cross-sectional view of a mold base 10 in which an inorganic material layer 16 and an aluminum film 18 are provided over the surface of the aluminum base 12. (d) is a schematic cross-sectional view of the moth-eye mold 100 which has an inverted antiglare structure and an inverted moth-eye structure superposed over the inverted antiglare structure.
Figure 1:
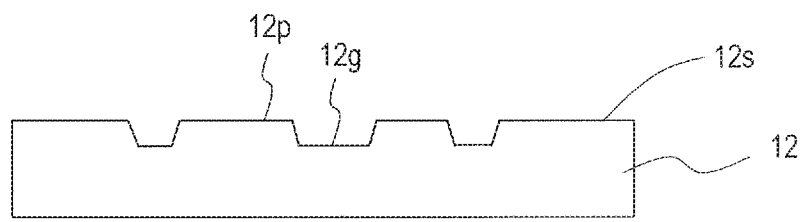
Figure 1:
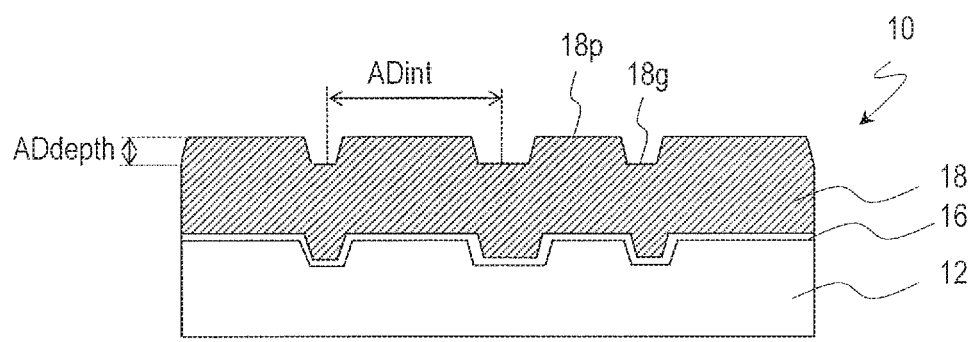
Figure 1:
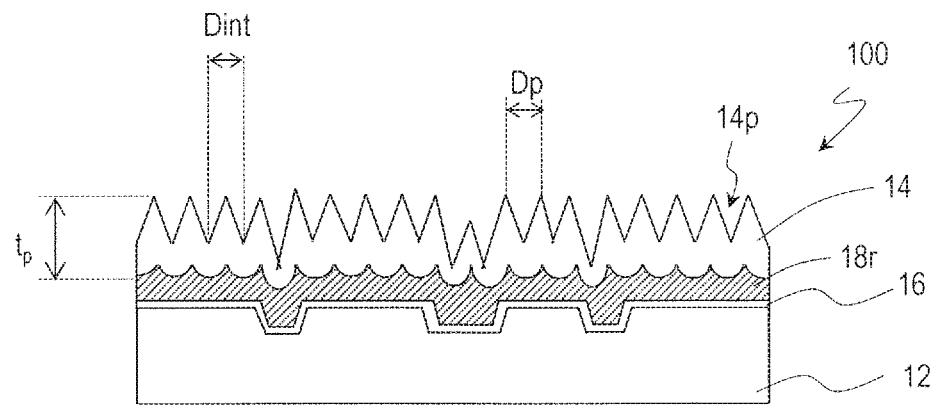
Figure 2:
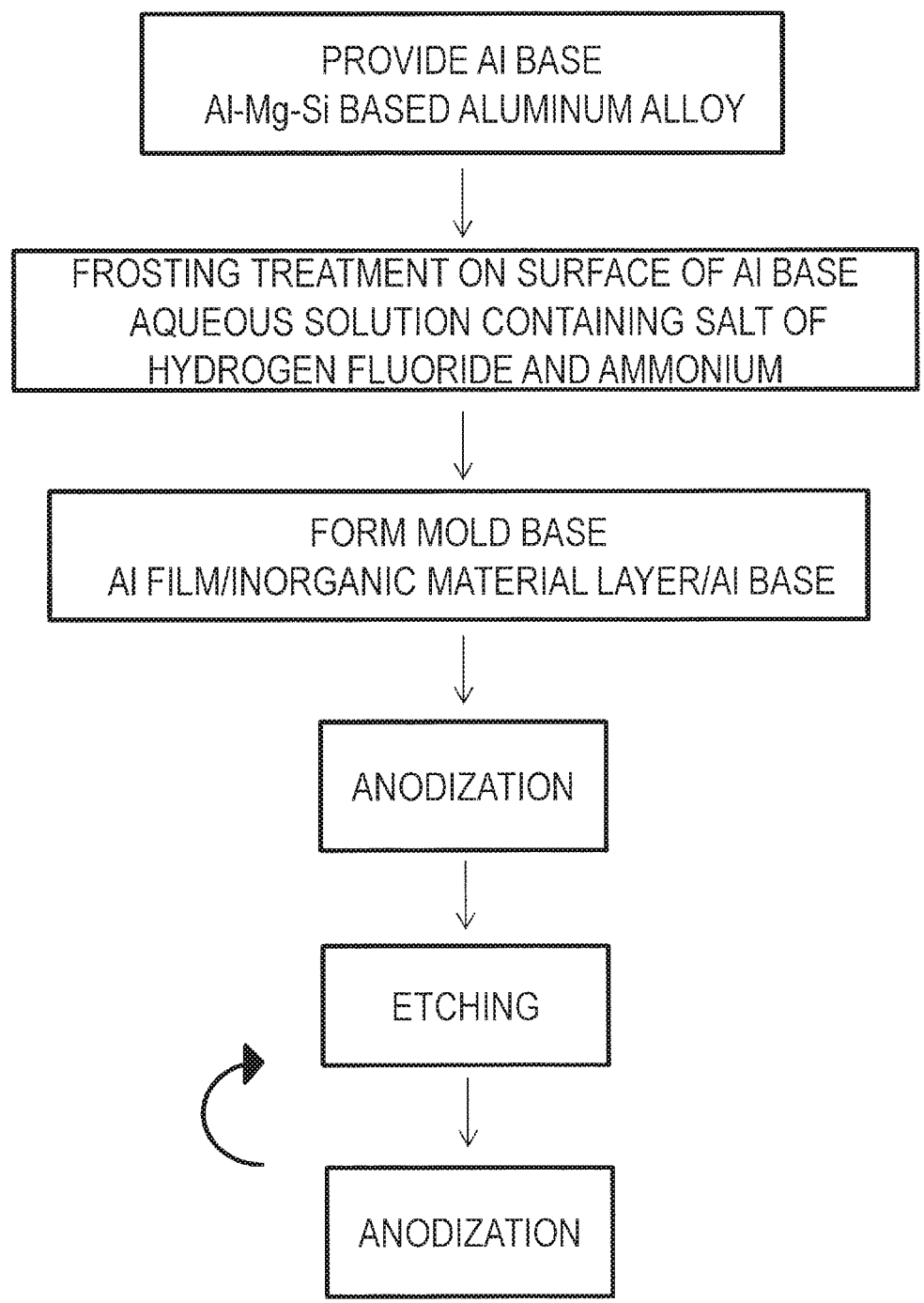
FIG. 2 A flowchart illustrating a manufacturing method of the moth-eye mold 100 according to an embodiment of the present invention.

Although FIG. 1 enlargedly shows part of the moth-eye mold 100, the moth-eye mold 100 of an embodiment of the present invention has the shape of a hollow cylinder (roll). As disclosed in WO 2011/105206 of the present applicant, when a moth-eye mold in the shape of a hollow cylinder is used, the antireflection film can be efficiently produced according to a fell-to-roll method. The entire disclosure of WO 2011/105206 is incorporated by reference in this specification.

First, as shown in FIG. 1(a), an aluminum base 12 in the shape of a hollow cylinder is provided which is made of an Al—Mg—Si based aluminum alloy and which is mechanically mirror-finished.

The mechanical mirror finishing is preferably bit cutting. If, for example, abrasive particles are remaining on the surface of the aluminum base 12, conduction will readily occur between the aluminum film 18 and the aluminum base 12 in a portion in which the abrasive particles are present. Not only in the portion in which the abrasive particles are remaining but also in a portion which has a roughened surface, conduction readily occurs between the aluminum film 18 and the aluminum base 12. When conduction occurs locally between the aluminum film 18 and the aluminum base 12, there is a probability that a local cell reaction will occur between an impurity in the aluminum base 12 and the aluminum film 18.

As will be described later with experimental examples, the effect of the chemical frosting treatment that is to be performed later varies depending on the material of the aluminum base 12. To obtain the above-described macro uneven structure, the aluminum base 12 which is made of an Al—Mg—Si based aluminum alloy (e.g., JIS A6063) is used.

The aluminum base 12 in the shape of a hollow cylinder is typically formed by hot extrusion. The hot extrusion includes mandrel extrusion and porthole extrusion. The aluminum base 12 used is preferably formed by mandrel extrusion. If formed by porthole extrusion, the aluminum base 12 in the shape of a hollow cylinder has a seam (weld line) in the outer perimeter surface. The seam is reflected in the moth-eye mold 100. Therefore, at some degrees of precision required of the moth eye mold 100, the aluminum base 12 used is preferably formed by mandrel extrusion.

Note that the problem of the seam can be solved by performing cold drawing on the aluminum base 12 formed by porthole extrusion. As a matter of course, cold drawing may also be performed on the aluminum base 12 formed by mandrel extrusion.

Then, a frosting treatment is performed on the surface of the aluminum base 12 using an aqueous solution containing the salt of hydrogen fluoride and ammonium, whereby an inverted antiglare structure is formed over the surface 12s of the aluminum base 12 as shown in FIG. 1(b). The inverted antiglare structure formed by the frosting treatment has a plurality of macro raised portions 12p and a plurality of macro recessed portions 12g. The macro raised portions 12p are substantially surrounded by the macro recessed portions 12g. The macro recessed portions 12g are groove-like structures which define the outer perimeter of the macro raised portions 12p.

The aqueous solution containing the salt of hydrogen fluoride and ammonium causes pitting corrosion. Examples of the salt of hydrogen fluoride and ammonium include ammonium fluoride (normal salt or neutral salt) and ammonium hydrogen fluoride (hydrogen salt or acid salt). The aqueous solution containing the salt of hydrogen fluoride and ammonium advantageously causes smaller adverse effects on a human body or environment than an aqueous solution of hydrogen fluoride. When the salt of hydrogen fluoride and ammonium is ammonium hydrogen fluoride, the concentration of the ammonium hydrogen fluoride is, for example, not less than 4 mass %. In addition to the ammonium hydrogen fluoride, ammonium dihydrogen phosphate and/or ammonium sulfate may be added. Here, and also in the experimental examples which will be described later, the etchant used for the frosting treatment of aluminum was ammonium hydrogen fluoride to which a small amount of ammonium dihydrogen phosphate and ammonium sulfate were added. For the sake of convenience, this etchant is referred to as "aqueous solution containing ammonium hydrogen fluoride". Such an etchant can be prepared using a Chemicleaner product manufactured by The Japan Cee-Bee Chemical Co., Ltd. The duration of the frosting treatment with the aqueous solution containing ammonium hydrogen fluoride is, for example, not less than 15 seconds and not more than 180 seconds when the treatment temperature is 35° C. The aqueous solution containing ammonium fluoride has a smaller etching power against aluminum than the aqueous solution containing ammonium hydrogen fluoride and therefore can achieve an effect which is equivalent to that achieved when the aqueous solution containing ammonium hydrogen fluoride is used, by appropriately adjusting the concentration, the treatment temperature, and the duration.

When necessary, a degreasing step and a water washing step are performed before the frosting treatment that is performed with the aqueous solution containing the salt of hydrogen fluoride and ammonium. The frosting treatment preferably performed within 15 minutes after the water washing step is finished. When necessary, water washing is preferably performed between the steps that are performed with different solutions.

When a frosting treatment was performed on the aluminum base 12 which had been mirror-finished by bit cutting without cold drawing, cutting scars were sometimes formed in the surface of the aluminum base 12. The cutting scars formed in the surface of the aluminum base 12 were reflected in the aluminum film 18 formed over the aluminum base 12. In this specification, not only the scars formed in the surface of the aluminum base 12 but also scars formed in the aluminum film 18 formed over the aluminum base 12, which are attributed to cutting, are referred to as "cutting scars".

The cutting scars can be reduced by performing an anodization step and an etching step for pretreatment before the frosting treatment. That is, the surface of the aluminum base 12 is once anodized, and the formed anodization film is etched away, whereby the cutting scars can be reduced. In this anodize Than step for pretreatment, the electrolytic solution used is preferably a sulfuric aqueous solution. In the etching step for pretreatment, the etchant used is preferably a phosphoric aqueous solution. As a matter of course, also when the aluminum base 12 is mirror-finished by bit cutting after cold drawing, occurrence of cutting scars In the surface of the aluminum base 12 can be more surely suppressed by performing an anodization step and an etching step for pretreatment.

Note that the above-described cutting scars can be estimated to be unevenness in the etching, which is attributed to a damaged layer formed over the surface of the aluminum base 12 by mirror finishing by means of bit cutting. Therefore, the problem of formation of cutting scars due to the frosting treatment is not limited to bit cutting but is common among cases where the aluminum base 12 used is mirror finished whereby a damaged layer is formed, and can be solved by performing the above-described anodization step and etching step for pretreatment. Among mirror finishing options, cutting, mechanical polishing (MP) such as grinding, and chemical mechanical polishing (CMP) in which both chemical polishing and mechanical polishing are used cause formation of a damaged layer. In this specification, "mechanical mirror finishing" includes MP and CMP.

Before the frosting treatment, the step of etching the surface of the aluminum base 12 (hereinafter, sometimes referred to as "base surface etching step") using an alkaline etchant may be further performed. Inc base surface etching step with the use of an alkaline etchant enables to remove at least part of the damaged layer of the aluminum base 12 which can be the cause of cutting scars.

The alkaline etchant includes, for example, an inorganic base (inorganic alkali) or an organic base (organic alkali). The inorganic base includes, for example, potassium hydroxide, sodium hydroxide, calcium hydroxide, magnesium hydroxide, or the like. The organic base includes, for example, a compound which has an amino group. The organic base includes, for example, 2-aminoethanol (ethanolamine), primary alkanolamine, dimethyl bis (2-hydroxy) ethyl, or the like. The pH of the alkaline etchant is, for example, not less than 10 and not more than 12. The alkaline etchant used is not limited to the aforementioned examples but may be, for example, a known alkaline washing solution.

The above-described base surface etching step may be performed, for example, before the anodization step and etching step for pretreatment. The above-described base surface etching step may be performed, for example, instead of the anodization step and etching step for pretreatment. The above-described base surface etching step can also serve as a degreasing step because the alkaline etchant is used.

When the base surface etching step is performed instead of the anodization step and etching step for pretreatment, the number of steps can be reduced. When the base surface etching step also serves as a degreasing step, the number of steps can be reduced. An aluminum base which has a surface of reduced unevenness can be obtained with a smaller number of steps. A mold for formation of an antireflection film which has an appropriate antiglare function can be efficiently manufactured. The production yield of an antireflection film which has an appropriate antiglare function can improve.

Next, as shown in FIG. 1(c), an inorganic material layer 16 is formed over the surface of the aluminum base 12, and an aluminum film 18 is formed over the inorganic material layer 16 whereby a mold base 10 is produced.

The surface of the aluminum film 18 has a structure in which an inverted antiglare structure formed by performing a frosting treatment on the surface of the aluminum base 12 is reflected. Here, the structure formed in the aluminum film 18 is also referred to as "inverted antiglare structure". The inverted antiglare structure formed in the surface of the aluminum film 18 has substantially the same configuration as the inverted antiglare structure formed in the surface of the aluminum base 12. Therefore, the inverted antiglare structure formed in the surface of the aluminum film 18 has a plurality of macro raised portions 18$p$ and a plurality of macro recessed portions 18$g$. The macro raised portions 18$p$ are substantially surrounded by the macro recessed portions

18g. The macro recessed portions 18g are groove-like structures which define the outer perimeter of the macro raised portions 18p.

The material of the inorganic material layer 16 may be, for example, tantalum oxide ($Ta_2O_5$) or silicon, dioxide ($SiO_2$). The inorganic material layer 16 can be formed by, for example, sputtering. When a tantalum oxide layer is used as the inorganic material layer 16 the thickness of the tantalum oxide layer is, for example, 200 am.

The thickness of the inorganic material layer 16 is preferably not less than 100 nm and less than 500 cm. If the thickness of the inorganic material layer 16 is less than 100 nm, there is a probability that a defect (typically, a void; i.e., a gap between crystal grains) occurs in the aluminum film 18. If the thickness of the inorganic material layer 16 is not less than 500 nm, insulation is likely to occur between the aluminum base 12 and the aluminum film 18 due to the surface condition of the aluminum base 12. To realize anodization of the aluminum film 18 by supplying an electric current from the aluminum base 12 side to the aluminum film 18 the electric current needs to flow between the aluminum base 12 and the aluminum film 18. When employing a configuration where an electric current is supplied from the inside surface of the aluminum base 12 in the shape of a hollow cylinder, it is not necessary to provide an electrode to the aluminum film 18. Therefore, the aluminum film 18 can be anodized across the entire surface, while such a problem does not occur that supply of the electric current becomes more difficult as the anodization advances. Thus, the aluminum film 18 can be anodized uniformly across the entire surface.

To form a thick inorganic material layer 16, it is in general necessary to increase the film formation duration. When the film formation duration is increased, the surface temperature of the aluminum base 12 unnecessarily increases, and as a result, the film quality of the aluminum film 18 deteriorates, and a defect (typically, a void) occurs in some cases. When the thickness of the inorganic material layer 16 is less than 500 nm, occurrence of such a problem can be suppressed.

The aluminum film 18 is, for example, a film which is made of aluminum whose purity is not less than 99.99 mass % (hereinafter, sometimes referred to as "high-purity aluminum film") as disclosed in. Patent Document 3. The aluminum film 18 is formed by, for example, vacuum evaporation or sputtering. The thickness or the aluminum film 18 is preferably in the range of not less than about 500 nm and not more than about 1500 nm. For example, the thickness of the aluminum film 18 is about 1 μm.

The aluminum film 18 may be an aluminum alloy film disclosed in WO 2013/0183576 in substitution for the high-purity aluminum film. The aluminum alloy film disclosed in WO 2013/0183576 contains aluminum, a metal element other than aluminum, and nitrogen. In this specification, the "aluminum film" includes not only the high-purity aluminum film but also the aluminum alloy film disclosed in WO 2013/0183576. The entire disclosure of NO 2013/0183576 is incorporated by reference in this specification.

Using the above-described aluminum alloy film enables to obtain a specular surface whose reflectance is not less than 80%. The average grain diameter of crystal grains that form the aluminum alloy film when viewed in the normal direction of the aluminum alloy film is, for example, not more than 100 nm, and that the maximum surface roughness Rmax of the aluminum alloy film is not more than 60 nm. The content of nitrogen in the aluminum alloy film is, for example, not less than 0.5 mass % and not more than 5.7 mass %. It is preferred that the absolute value of the difference between the standard electrode potential of the metal element other than aluminum which is contained in the aluminum alloy film and the standard electrode potential of aluminum is not than 0.64 V, and that the content of the metal element in the aluminum alloy film is not less than 1.0 mass % and not more than 1.9 mass %. The metal element is, for example, Ti or Nd. The metal element is not limited to these examples but may be such a different metal element that the absolute value of the difference between the standard electrode potential of the metal element and the standard electrode potential of aluminum is not more than 0.64 V (for example, Mn, Mg, Zr, V, and Pb). Further, the metal element may be Mo, Nb, or Hf. The aluminum alloy film may contain two or more of these metal elements. The aluminum alloy film is formed by, for example, a DC magnetron sputtering method. The thickness of the aluminum alloy film is also preferably in the range of not less than about 500 nm and not more than about 1500 nm. For example, the thickness of the aluminum alloy film is about 1 μm.

Figure 3:
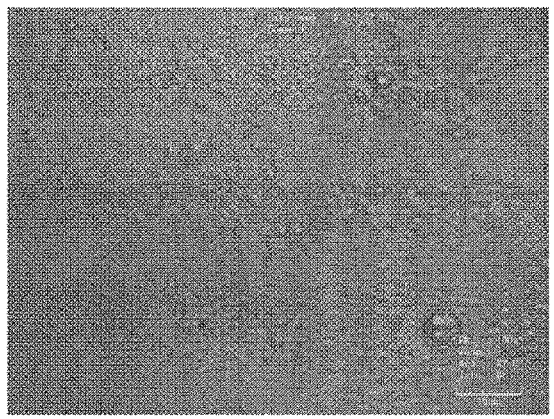
FIG. 3 (a) is a laser microscopic image of a surface of the aluminum base 12 which has inverted antiglare structure formed by a frosting treatment (the full scale in the microscopic image: 15 μm). (b) is a SEM image of a surface of the aluminum base 12 which has an inverted antiglare structure formed by a frosting treatment, which was viewed in a vertical direction (the full scale in the SEM image: 10 μm). (c) is a schematic plan view of the inverted antiglare structure. (d) is a schematic perspective view of the inverted antiglare structure.
Figure 3:
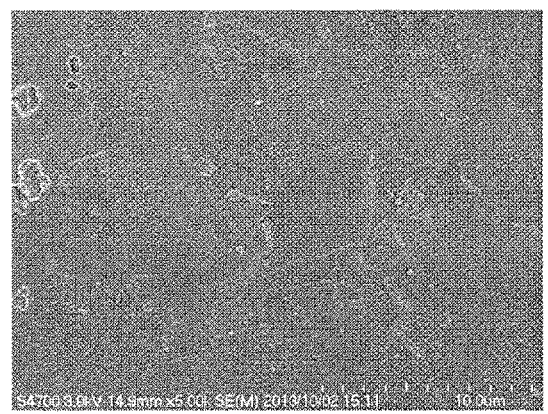
Figure 3:
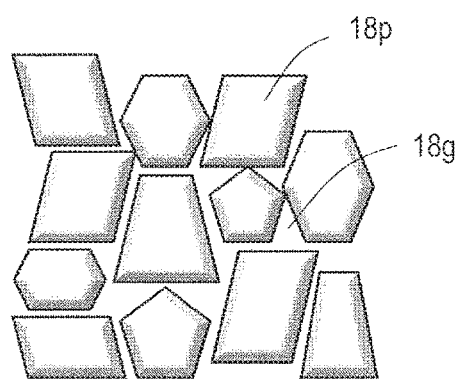
Figure 3:
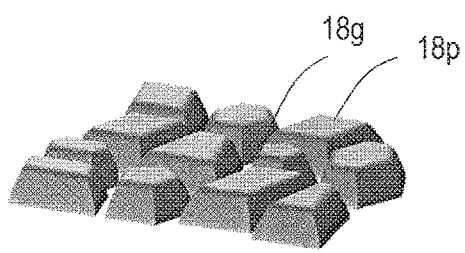
Figure 4:
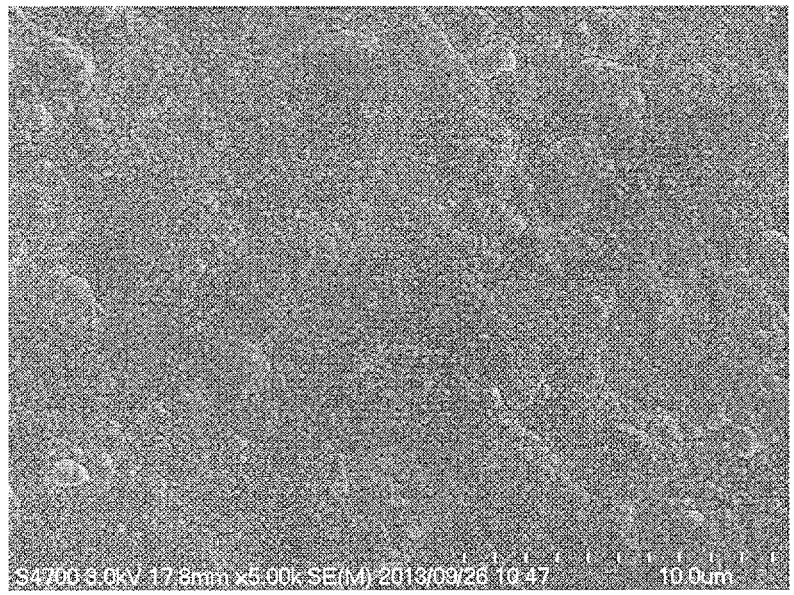
FIG. 4 (a) is a SEM image of a surface of the aluminum film 18 of the mold base 10, which was viewed in a vertical direction (the full scale in the SEM image: 10 μm). (b) is a SEM image of a porous alumna layer 14 of the moth-eye mold 100 which has an inverted moth-eye structure, which was viewed in a vertical direction (the full scale in the SEM image: 10 μm).
Figure 4:
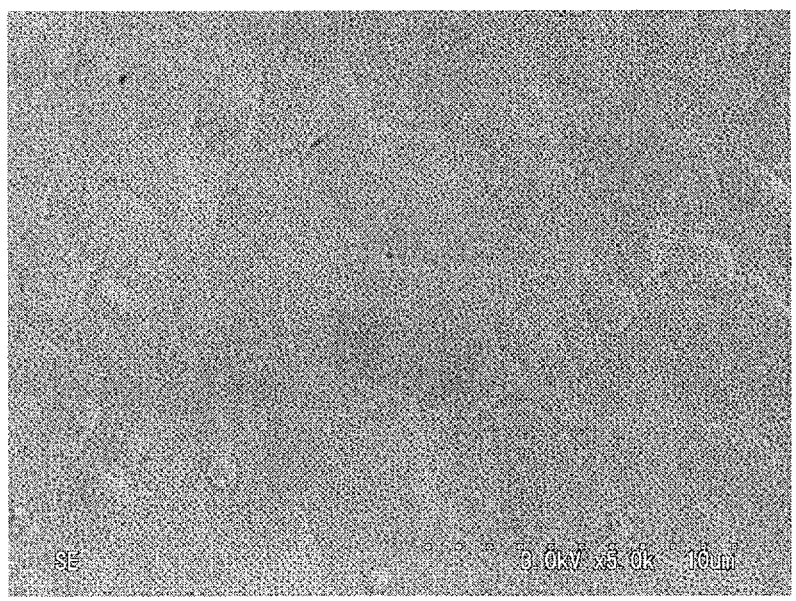

Now, the inverted antiglare structure is described with reference to FIGS. 3(*a*) to 3(*d*). FIG. 3(*a*) is a laser microscopic image of a surface of the aluminum base 12 which has an inverted antiglare structure formed by a frosting treatment (the full scale in the microscopic image: 15 μm). FIG. 3(*b*) is a SEM image of a surface of the aluminum base 12 which has an inverted antiglare structure formed by a frosting treatment, which was viewed in a vertical direction (the full scale in the SEM image: 10 μm). FIG. 3(*a*) is observation a surface of the aluminum base 12 which received a frosting treatment under the conditions for an experimental example which will be described later at an anodization temperature of 10° C. for an anodization duration of 5 min. FIG. 3(*b*) is observation of a surface of the aluminum base 12 which received a frosting treatment under the conditions for an experimental example which will be described later at an anodization temperature of 10° C. for an anodization duration of 3 min. FIG. 3(*c*) is a schematic plan view of the inverted antiglare structure. FIG. 3(*d*) is a schematic perspective view of the inverted antiglare structure.

As shown in FIGS. 3(*a*) to 3(*d*), the inverted antiglare structure formed by a frosting treatment has a plurality of macro raised portions 18p and a plurality of macro recessed portions 18g. The macro raised portions 18p are substantially surrounded by the macro recessed portions 18g. The macro recessed portions 18g are groove-like structures which define the outer perimeter of the macro raised portions 18p.

When viewed in a direction normal to the surface, the plurality of macro raised portions 18p have generally polygonal external shape, although no regularity can be seen in the arrangement of the macro raised portions 18p. The two-dimensional size area equivalent circle diameter) of the macro raised portions 18p when viewed in a direction normal to the surface is not less than about 200 nm and not more than 30 μm. From the microscopic image of FIG. 3(*a*) and the SEM image of FIG. 3(*b*), the two-dimensional size of the macro raised portions 18p when viewed in a direction normal to the surface can be estimated to be not less than about 1 μm and not more than about 5 μm. The upper surfaces of the macro raised portions 18p are substantially flat.

The width of the macro recessed portions (grooves) 18g that substantially surround the macro raised portions 18p is about 1/10 to 1/5 of the two-dimensional size of the macro raised portions 18p. The average of the distances between adjoining macro recessed portions 18g (average adjoining distance $AD_{int}$) can be considered to be generally equal to the average of the two-dimensional sizes the macro raised portions 18p when viewed in a direction normal to the surface. Since the macro recessed portions leg are provided so as to substantially surround the macro raised portions 18p, adjoining macro recessed portions leg mean adjoining macro recessed portions leg in a cross section in a direction which defines the two-dimensional size of the macro raised portions 18p. Therefore, average adjoining distance $AD_{int}$ is generally equal to the sum of the average of the two-dimensional sizes of the macro raised portions 18p and the average of the widths of the macro recessed portions 18g. Note that the depth of the macro recessed portions 18g, $AD_{depth}$, is for example not less than 20 nm and not more than 500 nm, although it only needs to be not less than 20 nm and less than 5 μm.

After formation of the inverted antiglare structure, anodization and etching are alternately repeated such that an inverted moth-eye structure is formed, whereby a moth-eye mold 100 shown in FIG. 1(d) is obtained. That is, the process of forming the inverted moth-eye structure includes: anodizing the surface of the aluminum film 18, thereby forming a porous alumina layer 14 which has a plurality of micro recessed portions 14p; thereafter, bringing the porous alumina layer 14 into contact with an etchant, thereby enlarging the plurality of micro recessed portions 14p of the porous alumina layer 14; and thereafter, further performing anodization, thereby growing the plurality of micro recessed portions 14p. The electrolytic solution used in the anodization is, for example, an aqueous solution which contains an acid selected from the group consisting of oxalic acid, tartaric acid, phosphoric acid, sulfuric acid, chromic acid, citric acid, and malic acid. The etchant used can be an aqueous solution of an organic acid such as formic acid, acetic acid or citric acid or a sulfuric acid, a chromate-phosphate mixture aqueous solution, or an alkaline aqueous solution of sodium hydroxide, potassium hydroxide, or the like.

A series of steps in which anodization and etching are repeated preferably ends with the anodization step. By ending with the anodization step (without performing any subsequent etching step), the micro recessed portions 14p can have small bottoms. Such a method for forming the inverted moth-eye structure is disclosed in, for example, WO 2006/059686 of the present applicant. The entire disclosure of WO 2006/059686 is incorporated by reference in this specification.

For example, by alternately repeating the anodization step (electrolytic solution: oxalic acid aqueous solution (concentration: 0.3 mass %, solution temperature: 10° C.), applied voltage: 80 V, duration of application: 55 seconds) and the etching step (etchant: phosphoric aqueous solution (10 mass %, 30° C.), etching duration: 20 minutes) through multiple cycles (e.g., 5 cycles: including 5 anodization cycles and 4 etching cycles), a moth-eye mold 100 is obtained as shown in FIG. 1(d), which includes the porous alumina layer 14 which has the micro recessed portions 14p. The porous alumina layer 14 formed under the conditions illustrated herein has such a configuration that micro recessed portions 14p whose $D_p=D_{int}$ is not less than 10 nm and less than 500 nm and whose $D_{depth}$ is not less than 10 nm and less than about 1000 nm (1 μm) are in an irregular closely-packed arrangement as previously described with reference to FIG. 17(c). The micro recessed portions 14p have a generally conical shape and adjoin one another so as inform saddle portions.

The inverted moth-eye structure formed by the micro recessed portions 14p are formed so as to be superposed over the antiglare structure. Therefore, as schematically shown in FIG. 1(d), some of the micro recessed portions 14p are formed in the macro raised portions 18p of the anti structure while the other micro recessed portions 14p are formed in the macro recessed portions 18g. The micro recessed portions 14p formed in the macro recessed portions 18g are deeper than the micro recessed portions 14p formed in the macro raised portions 18p.

Note that a barrier layer is provided under the micro recessed portions 14p. The porous alumina layer 14 consists of a porous layer which has the micro recessed portions 14p and the barrier layer that is present under the porous layer (aluminum film side), i.e., the bottom part of the recessed portions 14p. It is known that the distance between adjoining micro recessed portions 14p (the distance between the centers) is generally twice the thickness of the barrier layer and is generally proportional to the voltage applied during the anodization. Under the porous alumina layer 14, there is an aluminum remnant layer 18r, which is part of the aluminum film 18 which has not been anodized.

FIG. 4(a) shows a SEM image of a surface of the aluminum film 18 of the mold base 10, which was viewed in a vertical direction (the full scale in the SEM image: 10 μm). FIG. 4(b) shows a SEM image of a porous alumina layer 14 of the moth-eye mold 100 which has an inverted moth-eye structure, which was viewed in a vertical direction (the full scale in the SEM image: 10 μm). The mold base 10 of FIG. 4(a) is realized by forming a tantalum oxide layer which has a thickness of about 200 nm and an aluminum film (aluminum alloy film) 18 which has a thickness of about 800 nm and which contains Ti and N on an aluminum base 12 which has an inverted antiglare structure formed by performing a frosting treatment under the same conditions as those for the aluminum base 12 shown in FIG. 3(b). The content of Ti in the aluminum film 18 is about 1.0 mass %. The content of N in the aluminum film 18 is not less than about 1.2 mass % and not more than about 2.0 mass %. The remaining part of the aluminum film 18 contains Al and inevitable impurities. The moth-eye mold 100 of FIG. 4(b) is manufactured by alternatively repeating anodization and etching (5 anodization cycles and 4 etching cycles) under the previously-described conditions with the use of a mold base 10 which is produced under the same conditions as those for the mold base 10 shown in FIG. 4(a).

As clearly seen from the comparison between FIG. 4(a) and FIG. 3(b), the surface of the aluminum film 18 has a structure in which the inverted antiglare structure of the surface of the aluminum base 12 is reflected. Further, as clearly seen from the comparison between. FIG. 4(b) and FIG. 4(a), the porous alumina layer 14 of the moth-eye mold 100 has such a surface structure that the inverted moth-eye structure superposed over the inverted antiglare structure.

As described above, the manufacturing method of the moth-eye mold 100 according to an embodiment of the present invention enables to manufacture a moth-eye mold 100 which is capable of producing an antireflection film which has an antiglare function. The antiglare function of the antireflection film formed with the use of the moth-eye mold 100 will be described later in detail with experimental examples.

Figure 5:
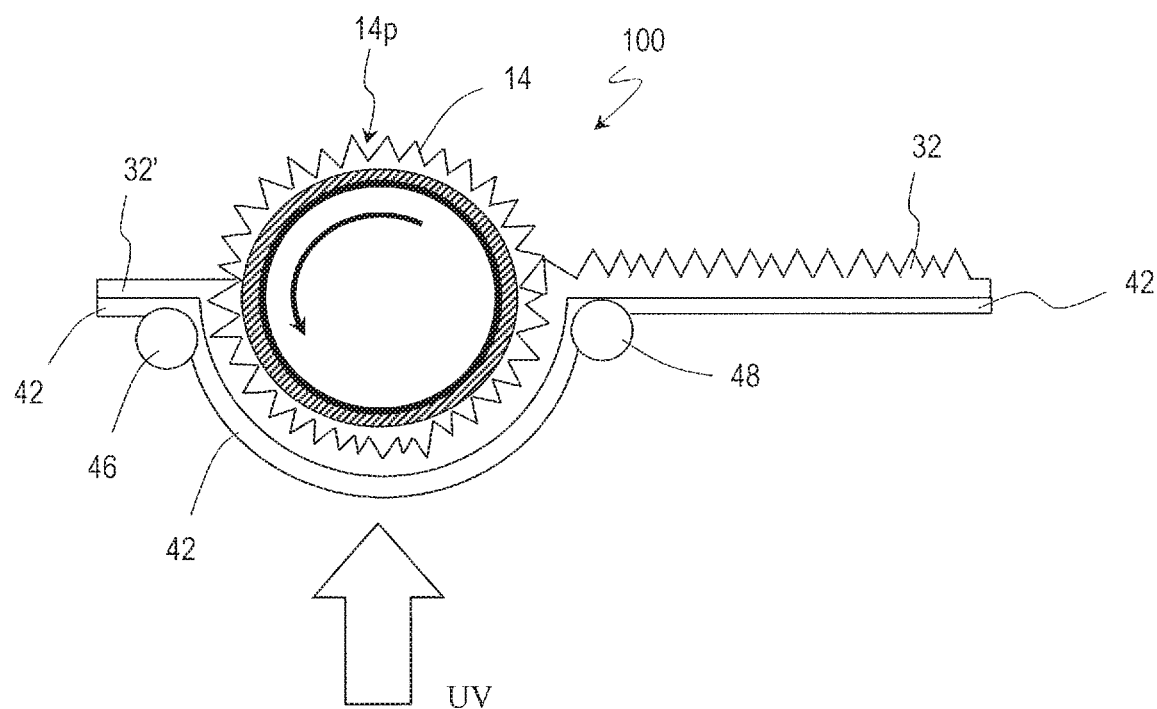
FIG. 5 A diagram for illustrating a production method of an antireflection film with the use of the moth-eye mold 100.

Next, a method for producing an antireflection film with the use of a moth-eye mold 100 is described with reference to FIG. 5. FIG. 5 is a schematic cross-sectional view for illustrating a method for producing an antireflection film according to a roll-to-roll method.

First, a moth-eye mold 100 in the shape of a hollow cylinder is provided. Note that the moth-eye mold 100 in the shape of a hollow cylinder is manufactured according to the above-described manufacturing method.

As shown in FIG. 5, a work 42 over which a UV-curable resin 32' is applied on its surface is maintained pressed against the moth-eye mold 100, and the UV-curable resin 32' is irradiated with ultraviolet (UV) light such that the UV-curable resin 32' is cured. The UV-curable resin 32' used may be, for example, an acrylic resin. The work 42 may be, for example, a TAC (triacetyl cellulose) film. The work 42 is fed from an unshown feeder roller, and thereafter, the UV-curable resin 32' is applied over the surface of the work 42 using, for example, a slit coater or the like. The work 42 is supported by supporting rollers 46 and 48 as shown in FIG. 5. The supporting rollers 46 and 48 have rotation mechanisms for carrying the work 42. The moth-eye mold 100 in the form of a cylinder is rotated at a rotation speed corresponding to the carrying speed of the work 42 in a direction indicated by the arrow in FIG. 5.

Thereafter, the moth-eye mold 100 is separated from the work 42, whereby a cured material layer 32 to which an uneven structure of the moth-eye mold 100 (inverted moth-eye structure) is transferred is formed on the surface of the work 42. The work 42 which has the cured material layer 32 formed on the surface is wound up by an unshown winding roller.

Figure 6:
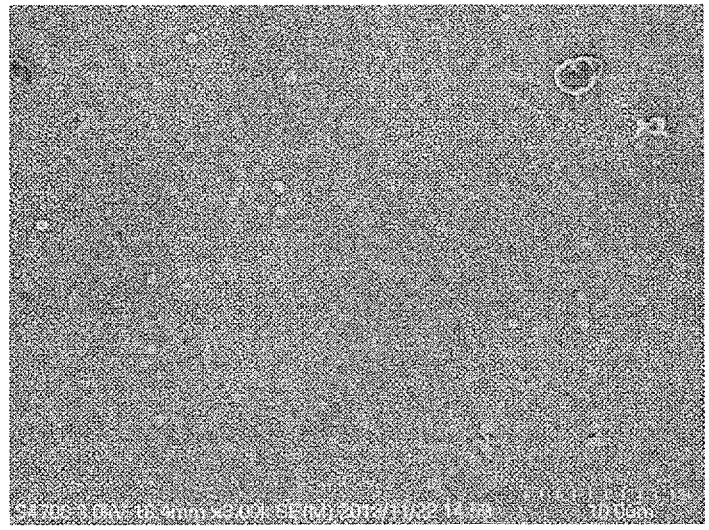
FIGS. 6 (a) and (b) are SEM images of an antireflection film which has an antiglare function according to an embodiment of the present invention. (a) is a SEM image of a surface of the antireflection film which was viewed in a vertical direction (the full scale in the SEM image: 10 μm). (b) is a SEM image of across section and a surface of the antireflection film which was viewed in an oblique direction (the full scale in the SEM image: 3 μm).
Figure 6:

FIGS. 6(a) and 6(b) show SEM images of an antireflection film produced as described above. FIGS. 6(a) and 6(b) are SEM images of an antireflection film which has an antiglare function according to an embodiment of the present invention. FIG. 6(a) is a SEM image of a surface of the antireflection film which was viewed in a vertical direction (the full scale in the SEM image: 10 μm). FIG. 6(b) is a SEM image of a cross section and a surface of the antireflection film which was viewed in an oblique direction (the full scale in the SEM image: 3 μm).

As seen from FIGS. 6(a) and 6(b), the moth-eye structure is superposed over the antiglare structure. The antiglare structure is realized by macro recessed portions and macro raised portions which are the inverse of the macro raised portions 18p and the macro recessed portions 18g which are formed by the frosting treatment. The two-dimensional size of the macro recessed portions of the antiglare structure illustrated herein when viewed in a direction normal to the surface is not less than about 1 μm and not more than about 5 μm, which is about ⅒ to ⅕ of the two-dimensional size of the macro raised portions of the antiglare structure. The height of the macro raised portions of the antiglare structure is not less than about 200 nm and not more than about 500 nm. The micro raised portions of the moth-eye structure have a two-dimensional size and an adjoining distance (corresponding to $D_p=D_{int}$) of about 200 nm and a height (corresponding to $D_{depth}$) of about 200 nm.

Figure 7:
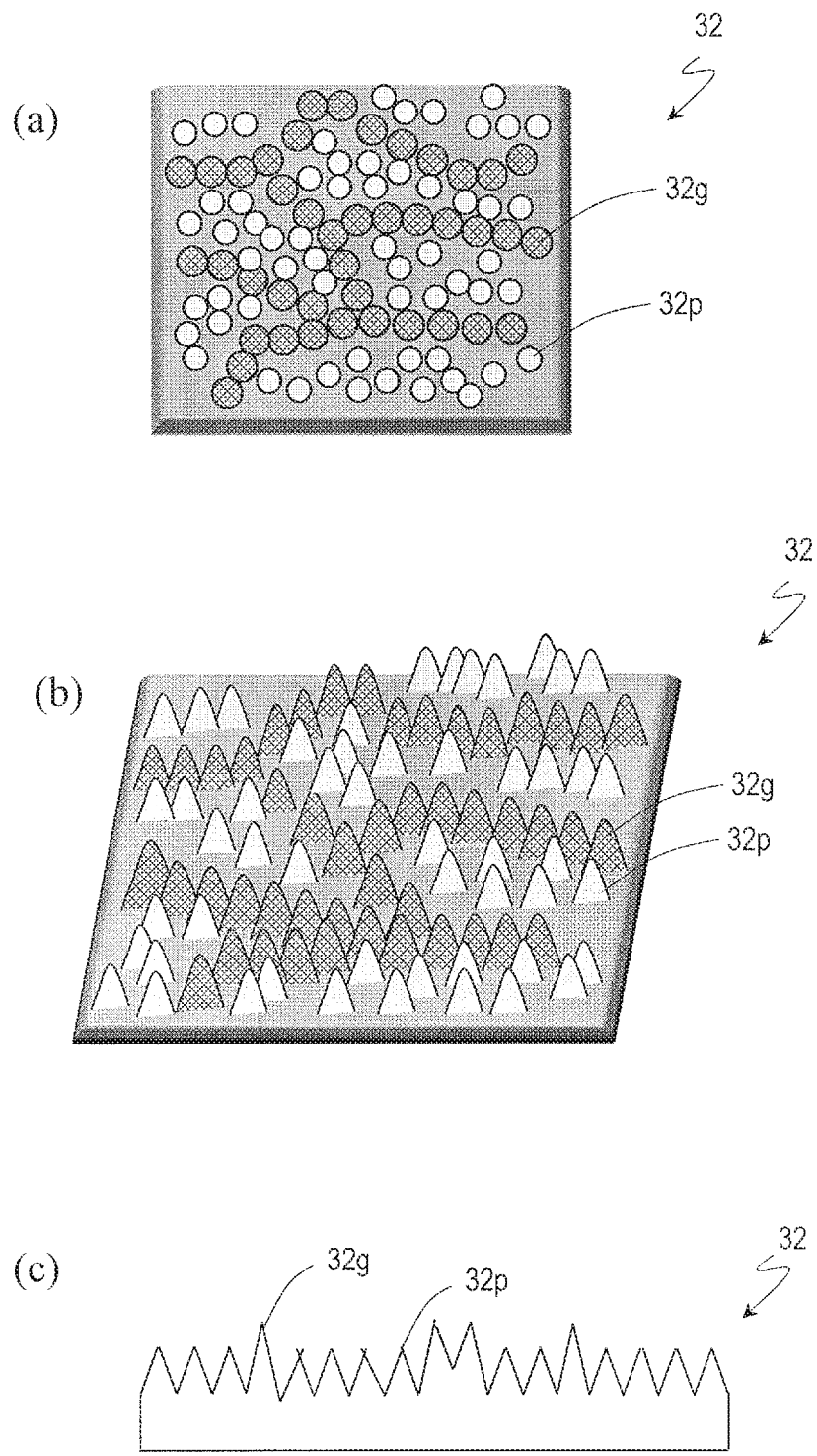
FIG. 7 (a) to (c) are schematic diagrams of an antireflection film which has an antiglare function according to an embodiment of the present invention. (a) is schematic diagram of surface of the antireflection film which was viewed in a vertical direction. (b) is a schematic diagram of the surface of the antireflection film which was viewed in an oblique direction. (c) is a schematic diagram of a cross section of the antireflection film.

The configuration of an antireflection film 32 which has an antiglare function according to an embodiment of the present invention is described with reference FIGS. 7(a) to 7(c). FIGS. 7(a) to 7(c) are schematic diagrams of the antireflection film 32 which has an antiglare function according to an embodiment of the present invention. FIG. 7(a) is a schematic diagram of a surface of the antireflection film 32 which was viewed in a vertical direction. FIG. 7(b) is a schematic diagram of the surface of the antireflection film 32 which was viewed in an oblique direction. FIG. 7(c) is a schematic diagram of a cross section of the antireflection film 32.

In FIGS. 7(a) to 7(c), the plurality of micro raised portions of the moth-eye structure include micro raised portions 32p and 32g. The micro raised portions 32p are formed in the macro recessed portions of the antiglare structure. The micro raised portions 32g are formed in the macro raised portions of the antiglare structure. Therefore, the micro raised portions 32g are higher than the micro raised portions 32p and are arranged so as to substantially surround the micro raised portions 32p formed in the macro raised portions. This corresponds to such a configuration that the macro raised portions 18p are substantially surrounded by the macro recessed portions 18g in the inverted antiglare structure formed by the frosting treatment in the process of manufacturing the moth-eye mold 100. It is confirmed from the microscopic images of FIGS. 6(a) and 6(b) that the micro raised portions formed are arranged so as to surround a large number of micro raised portions and are higher than the surrounded micro raised portions.

Figure 8:
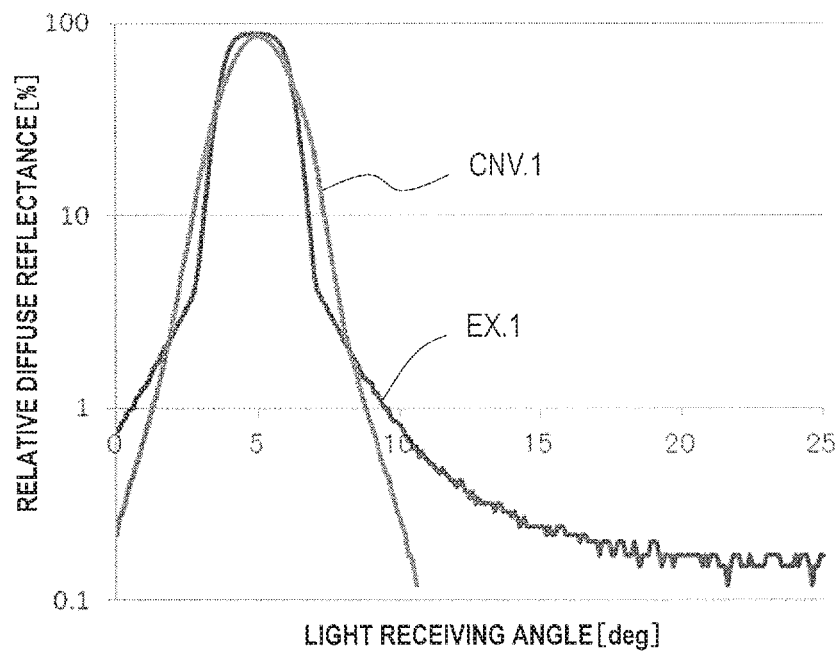
FIG. 8 (a) is a graph showing the measurement results of the light distribution of diffuse reflected light from an antireflection film which has an antiglare function. (b) is a schematic diagram showing a system for measurement of the light distribution of the diffuse reflected light.
Figure 8:
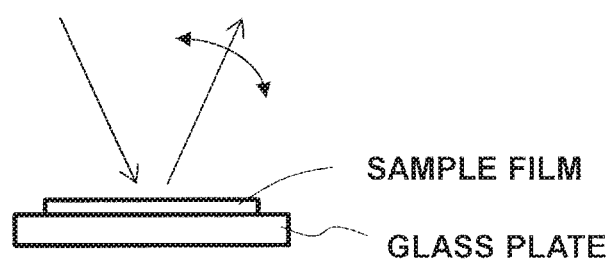

Next, the diffuse reflection characteristics of an antireflection film which has an antiglare function according to an embodiment of the present invention are described with reference to FIG. 8. FIG. 8(a) is a graph showing the measurement results of the light distribution of diffuse reflected light from an antireflection film which has an antiglare function. FIG. 8(b) is a schematic diagram showing a system for measurement of the light distribution of the diffuse reflected light. Note that the diffuse reflected light does not particularly exclude scattered fight.

In FIG. 8(a), EX. 1 represents the light distribution of the diffuse reflected light from an antireflection film which had an antiglare function according to an embodiment of the present invention. This antireflection film was an antiglare film which was produced using as a mold an aluminum base 12 that received a frosting treatment at 10° C. for 4 minutes with an aqueous solution containing ammonium hydrogen fluoride (the concentration of ammonium hydrogen fluoride was 4 mass %) in the same way as an experimental example which will be described later. CNV.1 represents the light distribution of the diffuse reflected light from an antireflection film which had an antiglare structure which had a continuous wave-like surface which had no flat portion, which was produced using an electrodeposition resin which contains a matting agent previously described with reference to FIG. 17. The antiglare structure of CNV.1 has a two-dimensional size of 10 μm to 30 μm and a height of 500 nm to 1000 nm.

The light distribution of the diffuse reflected light was measured in such a manner that the incidence angle of incident light relative to a sample film was 5° and the light receiving angle was 0° to 25° as shown in FIG. 8(b). Specifically, each sample film was attached to a glass plate, and the light distribution was measured using a gondophotometer. The goniophotometer used was GP-200 manufactured by MURAKAMI COLOR RESEARCH LABORATORY. Here, the light distribution curves are shown where the incidence angle is 5°, the horizontal axis represents the light receiving angle, and the vertical axis represents the common logarithm of the relative diffuse reflectance (%) which is normalized with the maximum of the diffuse reflected light intensity being 80%. This also applies to distribution curves which will be described below unless otherwise stated.

The light distribution of CNV.1 exhibits a peak value at the light receiving angle of 5° and lies within the range of the light receiving angles from 0° to 10°. The light distribution curve of CNV.1 is relatively steer) on the whole. The relative diffuse reflectance (%) monotonically decreases as the light receiving angle deviates from 5°. The conventional antireflection film (CNV.1) has a small haze value of about 3 but has low specular reflectivity, resulting in blurred images. Therefore, particularly when the conventional antireflection film (CNV. 1) is used in a high-definition image display panel, it gives the impression that it deteriorates the display quality.

On the other hand, the light distribution curve of EX. 1 exhibits a peak value at the light receiving angle of 5°. The changes of the relative diffuse reflectance (%) of EX. 1 in a range of the light receiving angles from about 3° to about 4° and a range of the light receiving angles from about 6° to about 7° are steeper than the change of the relative diffuse reflectance (%) of CNV.1. However, the change of the relative diffuse reflectance (%) of EX. 1 in a range of the light receiving angles of less than about 3° and more than about 7° is more moderate than the change of the relative diffuse reflectance (%) of CNV.1. EX. 1 has a haze value of about 15, which is higher than that of CNV.1, but is excellent in specular reflectivity. As will be described later with an experimental example, the antireflection film which has an antiglare structure according to an embodiment of the present invention (EX. 1) has such distinguishing diffuse reflection characteristics that a point at which the slope of the light distribution curve discontinuously varies is present within a range of light receiving angles of not less than 0° and not more than 10° and within a range of relative diffuse reflectances (%) of not less than 1% and not more than 10%. Therefore, the antireflecton film of EX. 1 has higher specular reflectivity than the conventional antireflection film (CNV.1) and has appropriate diffuse reflectivity (e.g., the haze value is not less than about 7 and not more than about 24). Even when used in a high-definition display of, for example, higher than 300 ppi, the antireflection film according to an embodiment of the present invention (EX. 1) can provide displaying such that images are prevented from being excessively blurred and reflection is suppressed with high display quality.

Hereinafter, a moth-eye mold and a manufacturing method of the moth-eye mold according to an embodiment of the present invention are described in more detail with an experimental example.

[Selection of Aluminum Base]

Al—Mg Based Aluminum Alloy

JIS A5052 was used as an Al—Mg based aluminum alloy. JIS A5052 has the following composition (mass %):

Si: not more than 0.25%; Fe: not more than 0.40%; Cu: not more than 0.10%; Mn: not more than 0.10%; Mg: 2.2-2.8%; Cr: 0.15-0.35%; Zn: not more than 0.10%; the other elements: each element is not more than 0.05%, the entirety of the other elements is not more than 0.15%; the remaining part: Al.

A mold base was produced using an aluminum base in the shape of a hollow cylinder which was made of JIS 35052 aluminum alloy. Here, the aluminum base used was an aluminum base produced by porthole extrusion, which was mirror-finished by bit cutting without cold drawing. Note that the mold base was produced by the method previously described with reference to FIG. 1(a). The inorganic material layer was a 200 nm thick tantalum oxide layer. The aluminum film was a 800 nm thick aluminum alloy film containing Ti and N. The content of Ti in the aluminum alloy film was about 1.0 mass %. The content of N in the aluminum alloy film was not less than about 1.2 mass % and not more than about 2.0 mass %. The remaining part of the aluminum alloy film was Al and inevitable impurities. This also applies to the experimental example which will be described later unless otherwise stated.

A chemical frosting treatment was performed on the aluminum base. The etchant used for the frosting treatment was an aqueous solution containing ammonium hydrogen fluoride (the concentration of ammonium hydrogen fluoride was 4 mass %). The resultant macro uneven structure was excessively coarse and has high diffuse reflectivity, so that an appropriate antiglare function was not achieved.

In view of such, the conditions of the frosting treatment were made mild (the treatment duration was reduced, the concentration of the treatment solution was decreased, and the treatment temperature was decreased), that unevenness was observed in the surface. Specifically, region of low diffuse reflectivity and a region of high diffuse reflectivity occurred on the order of several centimeters.

The present inventors concluded from the above that an aluminum base which is made of an Al—Mg based aluminum alloy is not suitable.

Al—Mg—Si Based Aluminum Alloy

JIS A6063 was used as an Al—Mg—Si based aluminum alloy. JIS A6063 has the following composition (mass %):

Si: 0.20-0.60%; Fe: not more than 0.35%; Cu: not more than 0.10%; Mn: not more than 0.10%; Mg: 0.45-0.9%; Cr: not more than 0.10%; Zn: not more than 0.10%; Ti: not more than 0.10%; the other elements: each element is not more than 0.05%, the entirety of the other elements is not more than 0.15%; the remaining part: Al.

A mold base was produced using an aluminum base in the shape of a hollow cylinder which was made of JIS A6063 aluminum alloy. Here, the aluminum base used was an aluminum base produced by porthole extrusion, which was mirror-finished by bit cutting without cold drawing.

A frosting treatment was performed on this aluminum base using an aqueous solution containing ammonium hydrogen fluoride. The resultant macro uneven structure had an appropriate antiglare function and had no in-plane unevenness except for a seam portion of the aluminum base produced by porthole extrusion.

Next, an aluminum base which was cold drawn and then mirror finished by means of bit cutting received a frosting treatment with an aqueous solution containing ammonium hydrogen fluoride. The resultant macro uneven structure had no conspicuous seam portion and no in-plane unevenness and exhibited an appropriate antiglare function.

In view of the above, an aluminum base which is made of an Al—Mg—Si based aluminum alloy, particularly JIS A6063, is preferred. Particularly, a cold-drawn aluminum base is preferred because the seam is not conspicuous. Note that, even in the case of hot extrusion, an aluminum base formed by mandrel extrusion can be preferably used in the same manner as an aluminum base formed by cold drawing because the aluminum base formed by mandrel extrusion has no seam.

Figure 9:
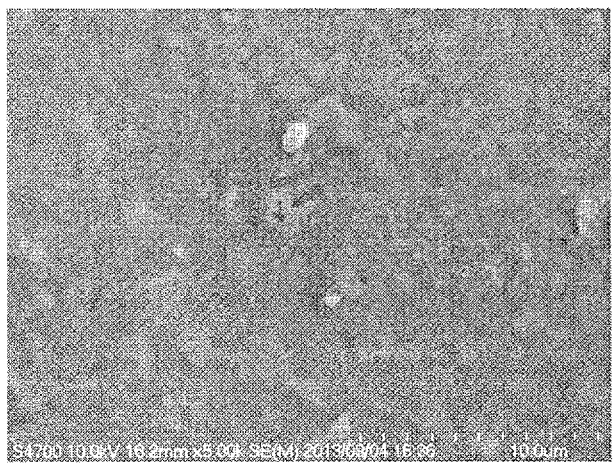
FIG. 9 (a) to (c) are SEM images of a surface of an aluminum base which received a frosting treatment with an aqueous solution containing ammonium hydrogen fluoride (5000 magnifications; the full scale in the SEM image: 10 μm).
Figure 9:
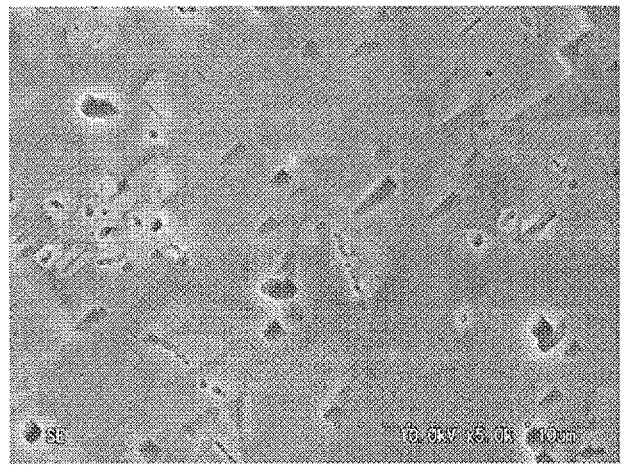
Figure 9:
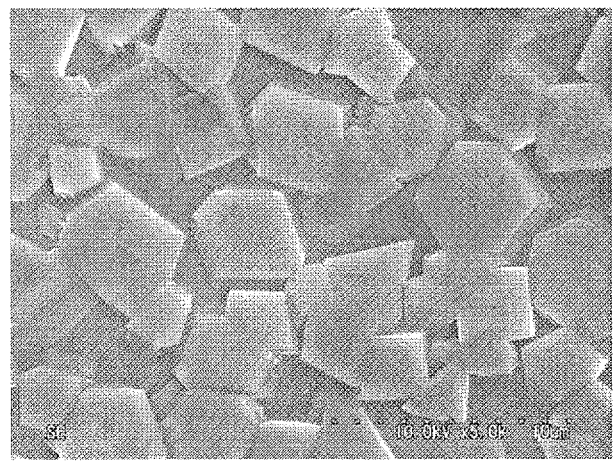

FIGS. 9(a) to 9(c) show SEM images of a surface of an aluminum base which received a frosting treatment with an aqueous solution containing ammonium hydrogen fluoride (5000 magnifications; the full scale in the SEM image: 10 μm). The SEM images were obtained using a field emission scanning electron microscope (S-4700 manufactured by Hitachi, Ltd.). This also applies to SEM images described below.

FIG. 9(a) is a SEM image of a surface of a JIS A6063 aluminum base which was cold drawn. FIG. 9(b) is a SEM image of a surface of a JIS A6063 aluminum base which was not cold drawn. FIG. 9(c) is a SEM image of a surface of a JIS A5052 aluminum base which was not cold drawn. In either case, the duration of the frosting treatment with the aqueous solution containing ammonium hydrogen was 45 seconds. Mote that, however, in the case of FIG. 9(a), degreasing and water washing were performed as pretreatments. In the cases of FIG. 9(b) and FIG. 9(c), anodization and etching were performed as pretreatments. The effects or these pretreatments will be described later.

As clearly seen from the comparison between FIGS. 9(a) and 9(b) and FIG. 9(c), the surface of the JIS A5052 aluminum base (FIG. 9(c)) had a very coarse uneven structure as compared with the surfaces of the JIS A6063 aluminum bases (FIGS. 9(a) and 9(b)). Therefore, an aluminum base which is made of an Al—Mg—Si based aluminum alloy, particularly JIS A6063, is preferred.

[Degreasing and Water Washing]

When the frosting treatment was performed on a JIS A6063 aluminum base which had been cold drawn, macro unevenness occurred in the surface of the aluminum base in some cases. To prevent occurrence of this macro unevenness, degreasing and water washing as pretreatments for the frosting treatment were examined.

In the degreasing, an aqueous solution was used in which the concentration of an inorganic alkaline detergent (L.G.L manufactured by YOKOHAMA OILS & FATS INDUSTRY CO. LTD.) was 3 mass %. Samples were immersed in this aqueous solution at 40° C. for 10 minutes. Thereafter, the samples were water-washed by immersion in pure water for 10 minutes. The water-washed samples were left in air for different durations (0 minutes, 5 minutes, 15 minutes, 22 hours). Thereafter, a frosting treatment was performed on the resultant samples.

When the water-washed aluminum base was not thoroughly dried before the frosting treatment, the surface of the resultant aluminum base had no unevenness (Conditions C1 and C2 in Table 1 below). When the water-washed aluminum base was once dried before the frosting treatment, unevenness was found across the entire surface of the resultant aluminum base (Condition C4). When the water-washed aluminum base was left in air for 15 minutes, slight unevenness was found (Condition C3).

When the degreased aluminum base is water-washed and dried, solid aluminum hydroxide precipitates on and adheres to the surface of the aluminum base. It is estimated that this aluminum hydroxide inhibits the effect of the treatment solution on the surface of the aluminum base, and as a result, unevenness occurs. Therefore, it is preferred that the frosting treatment is performed before the surface of the water-washed aluminum base is dried up. As a matter of course, when the aluminum base is water-washed again after being dried up and is then subjected to the frosting treatment before being dried up, occurrence of unevenness can be prevented. Preferably, the frosting treatment is performed within 15 minutes after the water washing step is finished.

Note that the agent used for the degreasing may be a surfactant (NICCA SUNCLEAN manufactured by NICCA CHEMICAL CO., LTD.) or sulfuric acid.

TABLE 1

| CON-DITION | DEGREASING | | WATER WASHING | | LEFT IN AIR | FROSTING TREATMENT | | UNEVENNESS |
|---|---|---|---|---|---|---|---|---|
| | TEMPERATURE | DURATION | TEMPERATURE | DURATION | (DURATION) | TEMPERATURE | DURATION | |
| C1 | 40° C. | 10 min | 20° C. | 2 min | 0 | 20° C. | 1 min | ○ |
| C2 | 40° C. | 10 min | 20° C. | 2 min | 5 min | 20° C. | 1 min | ○ |
| C3 | 40° C. | 10 min | 20° C. | 2 min | 15 min | 20° C. | 1 min | Δ |
| C4 | 40° C. | 10 min | 20° C. | 2 min | 22 hour | 20° C. | 1 min | x |

[Duration of Frosting Treatment]

To manufacture a moth-eye mold which is for production of an antireflection film which has an antiglare function, the present inventors examined the relationship between the duration of the frosting treatment and the degree of the diffuse reflectivity. The results of that examination are described in this section. In an experiment described below, a cold-drawn JIS A6063 aluminum base was used. The etchant used for the frosting treatment was an aqueous solution containing ammonium hydrogen fluoride (the concentration of ammonium hydrogen fluoride was 4 mass %).

Mold samples were manufactured with the duration of the frosting treatment on the aluminum base varying in the range of 5 seconds to 3 minutes. The frosting treatment temperature was 35° C. Note that degreasing was performed using a surfactant before the frosting treatment was performed, and the frosting treatment was performed within 15 minutes after the water washing step was finished.

A mold releasing agent (OPTOOL DSX manufactured by DATKIN INDUSTRIES, LTD) was applied to a surface of the aluminum base which had received the frosting treatment. Then, an acrylic UV-curable resin was applied over the surface and transferred to a PET film. The transferred resin on the film was exposed to UV light so that the resin was cured. The resultant sample film which has a macro uneven structure was used in measurement of the light distribution by the method previously described with reference to FIG. 8(b). A film which does not have a moth-eye structure but has only an antiglare structure, such as the sample film used herein, is sometimes referred to as "antiglare film".

The light distributions of sample films for reference, which were various antiglare films (REF_No. 1 to No. 4) the applicant uses for television purposes, were also evaluated. The antiglare film used herein was formed by applying a coating agent (resin) containing microparticles dispersed therein to the surface of the film. Due to diffuse reflection by the surface which has a macro uneven structure formed by microparticles and diffuse reflection by the interface between the coating agent and the microparticles (including scattering), the antiglare film performs an antiglare function. On the other hand, the antireflection film according to an embodiment of the present invention which has previously been described with reference to FIG. 8(a) (FX. 1) and an antiglare film which will be described later perform an antiglare function only with the surface structure which has a macro uneven structure.

Figure 10A:
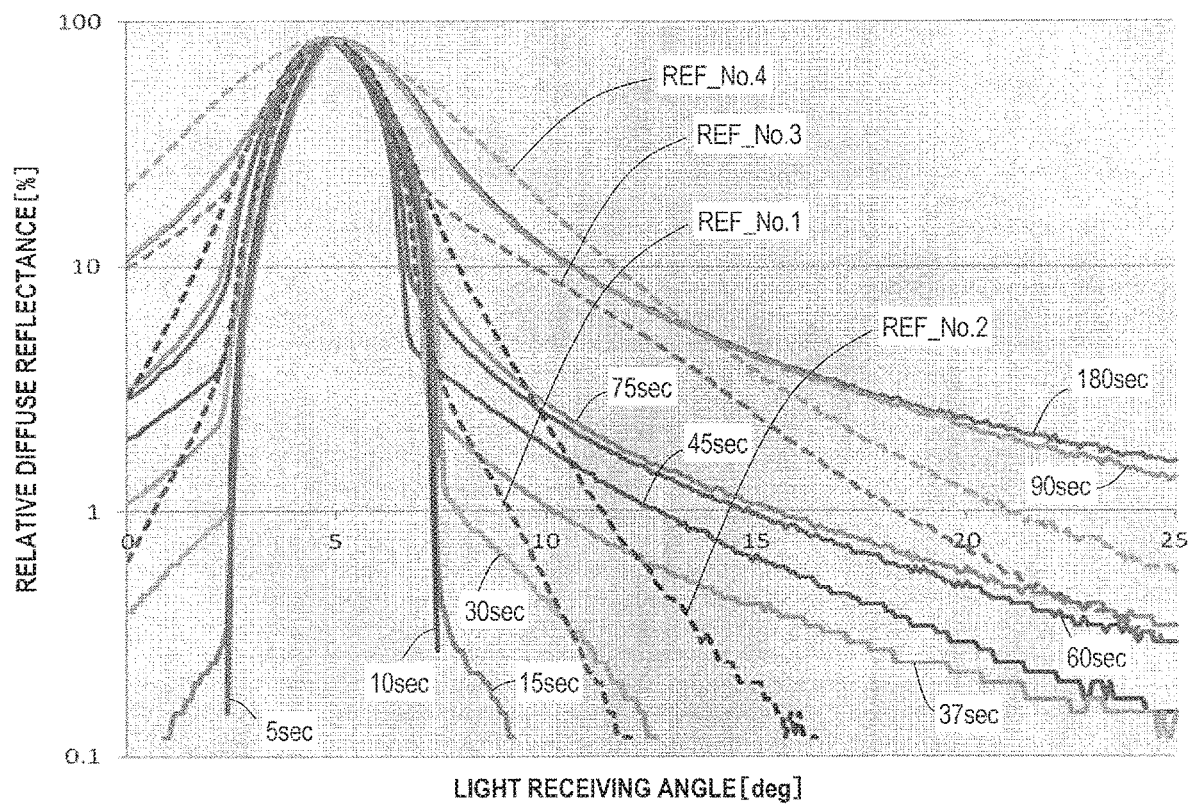
FIG. 10 A graph showing the light distribution of diffuse reflected light from sample films produced using, as the mold, aluminum bases (mold bases formed by cold drawing) among which the duration of the frosting treatment (treatment temperature: 35° C.) was different.
FIG. 10B A diagram showing the model calculation results evaluation of the antiglare function and the specular reflectivity.

FIG. 10A shows the results of measurement of the light distribution of diffuse reflected light. FIG. 10A also shows the light distribution curve as does FIG. 8(a), where the incidence angle is 5°, the horizontal axis represents the light receiving angle, and the vertical axis represents the common logarithm of the relative diffuse reflectance (%) which is normalized with the maximum of the diffuse reflected light intensity being 80%.

It can be seen from the results of FIG. 10A that, as the duration of the frosting treatment increases, the portion of diffuse reflected light at large light receiving angles increases. That is, as the duration of the frosting treatment increases, the antiglare function improves. When the treatment duration was 37 seconds, the haze value was about 7. When the treatment duration was 45 seconds, the haze value was about 10. When the treatment duration was 75 seconds, the haze value was about 24. When the treatment duration was 90 seconds, the haze value was about 40. The haze value of REL. No. 1 was 2, and the haze value of No. 3 was about 40 which was the largest among the REF samples. Note that the haze value was calculated from the formula of (diffuse transmittance/total transmittance)×100 using a haze meter NDH2000 manufactured by NIPPON DENSHOKU INDUSTRIES CO., LTD.

When the duration of the frosting treatment is not more than 30 seconds, the variation of the light distribution of diffuse reflected light is small so that the antiglare effect is almost zero. Even when the duration of the frosting treatment is not less than 90 seconds, the light distribution of diffuse reflected light scarcely varies so that the antiglare effect does not improve any more. From the viewpoint of the antiglare function, it is preferred that the duration of the frosting treatment is more than 30 seconds and less than 90 seconds.

The light distribution of diffuse reflected light of sample films of which the duration of the frosting treatment is in the range of not less than 37 seconds and not more than 75 seconds has such characteristics that a point at which the slope of the light distribution curve discontinuously varies is present within a range of the light receiving angles of not less than 0° and not more than 10° and within a range of the relative diffuse reflectances (%) of not less than 1% and not more than 10%. Specifically, the slope of the light distribution curve of these sample films discontinuously varies (the absolute value of the slope discontinuously decreases) in ranges of the light receiving angle from about 2° to about 3° and from about 7° to about 8°. These sample films have an appropriate antiglare function (the haze value is not less than about 7 and not more than about 24) and appropriate specular reflectivity.

The present inventors evaluated the antiglare function and the specular reflectivity. The results of the evaluation are described with reference to FIG. 10B. FIG. 10B shows the results of observation of a white/black pattern indicated by ORG through respective sample films, which were obtained by simple model calculation based on the above-described results of measurement of the light distribution of diffuse reflected light. That is, this is equivalent to a light distribution of diffuse reflected light which is obtained with the white/black pattern being placed at the position of the glass plate of FIG. 8(b).

CNV.1 is the result of calculation with the use of the light distribution of diffuse reflected light shown in FIG. 8(a). E30, E45, E60 and E90 are the results of calculation with the use of the light distributions of diffuse reflected light shown in FIG. 10A, where the numerals represent the duration of the frosting treatment.

Figure 10B:
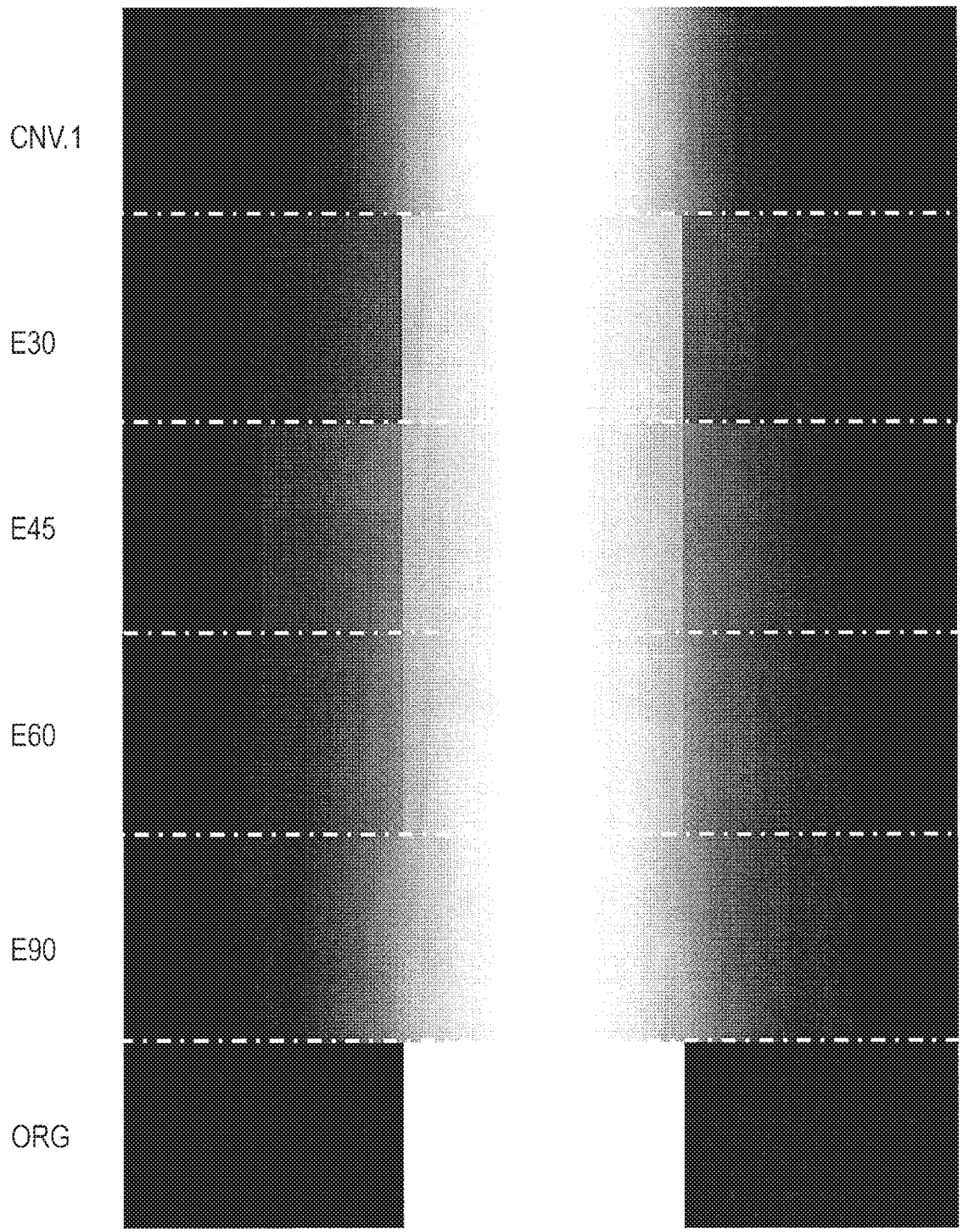

Each region of the white/black pattern of FIG. 10B indicated by ORG consists of 233 cells (corresponding to pixels). The intensity of light which reaches eyes of an observer when the observer observes each cell was calculated as follows.

For example, consider the $n^{th}$ cell. The intensity of light which reaches eyes of an observer when the observer observes the $n^{th}$ cell was obtained by adding, to the intensity of light outgoing from the $n^{th}$ cell multiplied by the relative diffuse reflectance (%) at 0.0° of the above-described light distribution curve, the intensity of light outgoing from 50 cells on both sides of the $n^{th}$ cell, specifically, the intensity of light outgoing from the $n-1^{th}$ and $n+1^{th}$ cells multiplied by the relative diffuse reflectance (%) at 0.1° of the above-described light distribution curve, the intensity of light outgoing from the $n-2^{th}$ and $n+2^{th}$ cells multiplied by the relative diffuse reflectance (%) at 0.2° of the above-described light distribution curve, and so on.

As seen from CNV.1 of FIG. 10B, the borders between black and white parts are blurred so that the borders cannot be clearly perceived. Thus, the antireflection film of CNV.1 which has a diffuse reflection function exhibits low specular reflectivity, so that images are blurred, although it has a small value, 3.

Meanwhile, as for the sample films (antiglare films) of E45 to E60 of FIG. 10B, the borders between black and white parts can be clearly perceived. In terms of the antiglare function, the width of a gray part intruding into a black part is greater than that of CMV.1. Thus, it can be said that the antiglare function is high.

In the sample film of E30, the specular reflectivity is excessively high so that the borders between black and white parts can be clearly perceived. In the sample film of E90, the specular reflectivity is excessively low so that the borders between black and white parts cannot be clearly perceived. This accord with the results of subjective evaluation by visual observation. To obtain an antireflection film (antireflection surface) which has an appropriate antiglare function and appropriate specular reflectivity, it is preferred that the duration of the above-described frosting treatment is more than 30 seconds and less than 90 seconds.

Thus, a sample film of which the duration of the frosting treatment is more than 30 seconds and less than 90 seconds has an appropriate antiglare function and appropriate specular reflectivity. Therefore, even when used in a high-definition display of, for example, higher than 300 ppi, images are prevented from being excessively blurred.

The preferred duration of the frosting treatment can be appropriately optimized according to the concentration or temperature of the treatment solution. For example, when the aqueous solution containing hydrogen fluoride and ammonium is an aqueous solution containing 5 mass % ammonium fluoride, the frosting treatment is performed at 25° C. for 120 seconds, whereby the same result as that of the above-described example in which the aqueous solution containing 4 mass % ammonium fluoride was used (treatment duration: 45-60 seconds).

When the duration of the frosting treatment is short, there is a probability that a problem arises in mass productivity. Therefore, it is preferred that the mass productivity (controllability) is improved in a range where the throughput is not excessively decreased. In view of such, the present inventors examined decreasing the temperature of the frosting treatment such that the duration of the frosting treatment is increased.

The relationship between the duration of the frosting treatment and the light distribution of diffuse reflected light, where the frosting treatment was performed at 10° C. using an aqueous solution containing ammonium hydrogen fluoride whose concentration was 4 mass %, is described with reference to FIG. 11.

Figure 11:
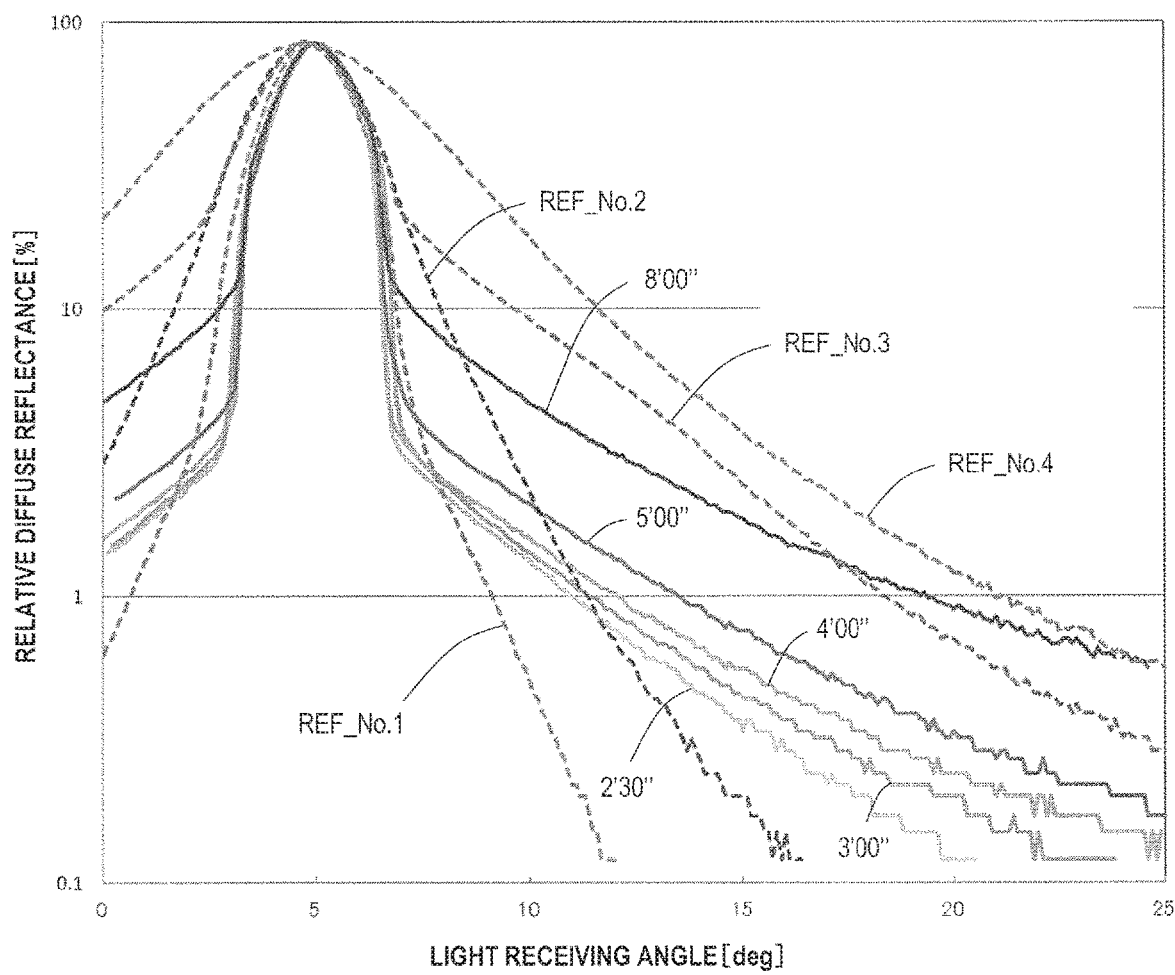
FIG. 11 A graph showing the light distribution of diffuse reflected light from sample films produced using, as the mold, aluminum bases (mold bases formed by cold drawing) among which the duration of the frosting treatment (treatment temperature: 10° C.) was different.

As seen from FIG. 11, the light distribution of diffuse reflected light of the sample films for which the treatment duration was not less than 2 minutes and 30 seconds and not more than. 8 minutes were within the range of the light distribution of diffuse reflected light of REF_No. 1 to No. 4. It was found that, even when the treatment temperature is decreased, a surface which has antiglare performance (antiglare structure) which generally covers the antiglare performance of various antiglare films presently used in the art can be formed by increasing the treatment duration. That is, by decreasing the treatment temperature from 35° C. to 10° C., the range of the appropriate treatment duration can be enlarged from the range of more than 30 seconds and less than seconds to the range of not less than 2 minutes and 30 seconds and not more than 8 minutes. Decreasing the treatment temperature in this way provides an advantage that the margin of the duration of the frosting treatment can be increased.

When the concentration of the ammonium hydrogen fluoride aqueous solution was lower than 4 mass %, crystal grains became conspicuous so that an appropriate antiglare function cannot be achieved in some cases. Therefore, it is preferred that the concentration of the ammonium hydrogen fluoride aqueous solution used for the frosting treatment is not less than 4 mass %.

Although there is no particular upper limit on the concentration of the ammonium fluoride aqueous solution, there is a probability that a surface of appropriate diffuse reflection cannot be formed when it exceeds 19 mass %. Therefore, it is preferred that the concentration of the ammonium hydrogen fluoride aqueous solution is not more than 19 mass %.

[Suppress Effect of Cutting Scars in Aluminum Base]

When the frosting treatment was performed on an aluminum base which had been mirror-finished by bit cutting without cold drawing, cutting scars were formed in the surface of the aluminum base in some cases. These cutting scars are considered to be etching unevennesses which were attributed to a damaged layer which was formed over the surface of the aluminum base due to the mirror finishing by means of bit cutting. Therefore, the problem of formation of cutting scars by the frosting treatment is not limited to bit cutting but is common among cases where the aluminum base used is mirror finished whereby the damaged layer is formed. Note that, it is estimated that, when the cold drawing is performed, a damaged layer is formed by plastic deformation across the entire aluminum base, and therefore, the effects of the mirror finishing which is to be subsequently performed are reduced.

As a result of various examinations, it was found that performing the anodization step and etching step for pretreatment before the frosting treatment is performed with the aqueous solution containing the salt of hydrogen fluoride and ammonium enables to reduce the cutting scars. That is, a surface mirror-finished by bit cutting is anodized, and the formed anodization film is removed by etching, whereby cutting scars formed in the surface of the aluminum base can be reduced.

The electrolytic solution used in the anodization is preferably a sulfuric aqueous solution. When a sulfuric aqueous solution is used, the resultant anodization film is softer than that formed when an oxalic acid is used. Therefore, the anodization film can be easily removed using, for example, a phosphoric aqueous solution. The anodization with the use of a sulfuric aqueous solution is preferably performed, for example, at 20° C. with a constant current of 115 A/m$^2$ for the duration of 24 minutes and 30 seconds. If the duration of the anodization is shorter than 24 minutes and 30 seconds, there is a probability that cutting scars are formed.

The results of an experimental example carried out using a mold base which was manufactured using an aluminum base (JIS A6063) which was mirror-finished by bit cutting without cold drawing.

Figure 12:
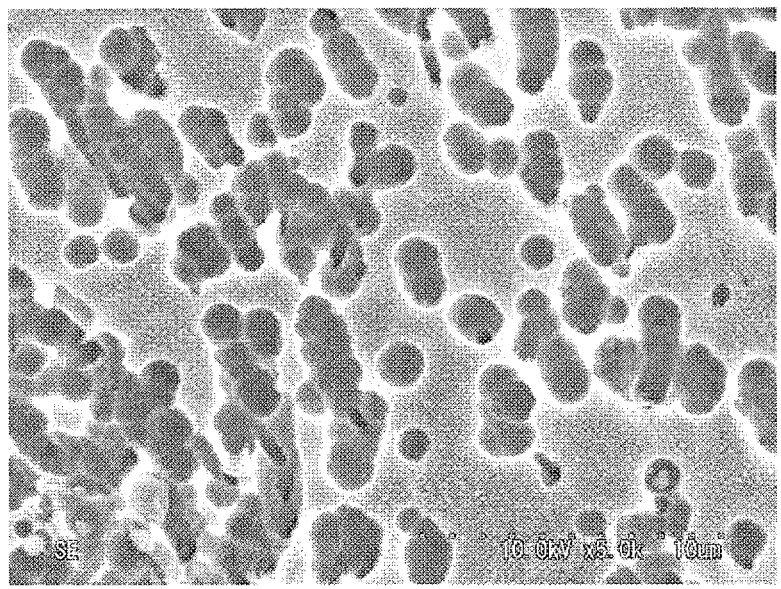
FIGS. 12 (a) and (b) are SEM images of surfaces of aluminum bases (mold bases which were not cold drawn) on which anodization and etching were performed as pretreatments for the frosting treatment. (a): the electrolytic solution used was an oxalic aqueous solution. (b): the electrolytic solution used was a sulfuric aqueous solution.
Figure 12:
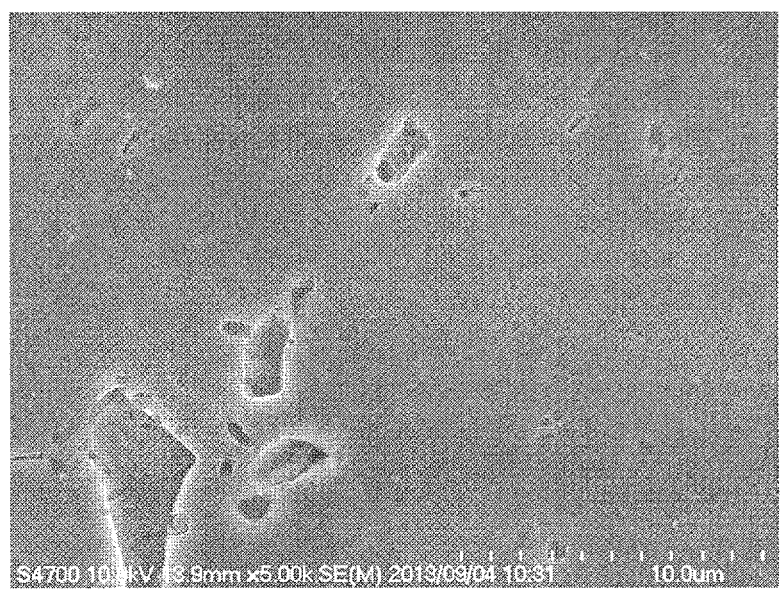

FIG. 12(a) shows a SEM image (5000 magnifications; the full scale in the SEM image: 10 μm) of an aluminum base on which anodization (80 V, 10 minutes) with the use of an oxalic acid aqueous solution (concentration: 0.3 mass %) and thereafter to etching (30° C., 90 minutes) with the use of a phosphoric aqueous solution. (concentration: 10 mass %) were performed. FIG. 12(b) shows P SEM image (5000 magnifications; the full scale in the SEM image: 10 μm) of a surface of an aluminum base on which anodization (constant current 115 A/m$^2$, 20° C., 24 minutes and 30 seconds) with the use of a sulfuric aqueous solution. (concentration: 17 mass %) and thereafter to etching (30° C., 12 minutes) with the use of a phosphoric aqueous solution (concentration: 10 mass %) were performed.

As seen from FIG. 12(a), the surface of the aluminum base which was anodized using an oxalic acid has a large number of recessed portions. This is because the oxide film formed by the anodization with the use of an oxalic acid was hard and unlikely to be etched away, so that the etching slowly advanced with the oxide film partially remaining. It is estimated that, in this process, galvanic corrosion advanced at the surface from which the oxide film was removed, and as a result, a large number or recessed portions were formed. Note that the galvanic corrosion occurs between Ti and Al contained in an aluminum film.

On the other hand, as seen from FIG. 12(b), recessed portions formed by galvanic corrosion are not seen in the surface of the aluminum base which was anodized using a sulfuric acid. It is estimated that this is because the oxide film formed by the anodization with the use of a sulfuric acid was soft and easily removed by etching. As illustrated herein, when the anodization is performed using a sulfuric acid, the anodization film can be removed only by thereafter performing the etching for 12 minutes.

The present inventors examined the etching duration which is necessary for removal of an oxide film formed by anodization with the use of a sulfuric acid. The conditions of the anodization were the same as the above-described conditions (constant current 115 A/m$^2$, 20° C., 24 minutes and 30 seconds) A phosphoric aqueous solution (concentration: 0.3 mass %) was used. The anodization temperature was 30° C. Whether or not there was a remaining oxide film was checked with varying etching durations: 1 minutes, 3 minutes, 5 minutes, 10 minutes and 12 minutes. As a result, the present inventors found that the oxide film can be removed when the etching is performed for 5 minutes or longer. Examples of the results of the experiment are presented below.

Figure 13:
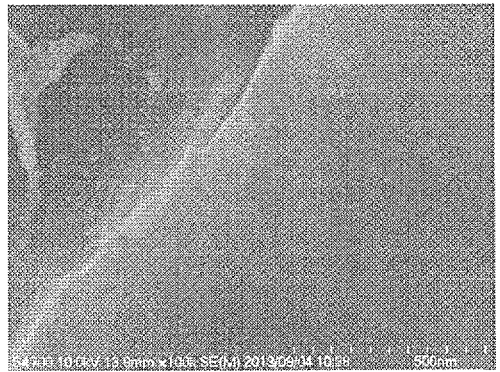
FIG. 13 (a) to (d) are SEM images of surfaces of samples with different durations of etching that was performed using a phosphoric aqueous solution after anodization performed with the use a sulfuric aqueous solution as a pretreatment for the frosting treatment.
Figure 13:
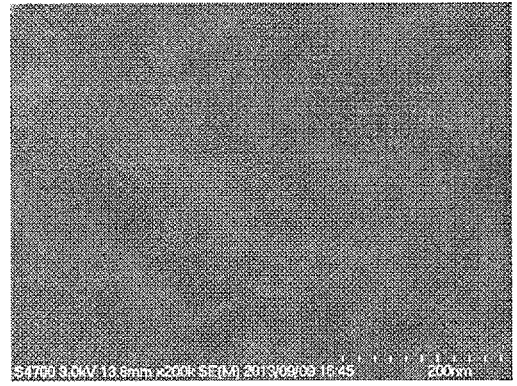
Figure 13:
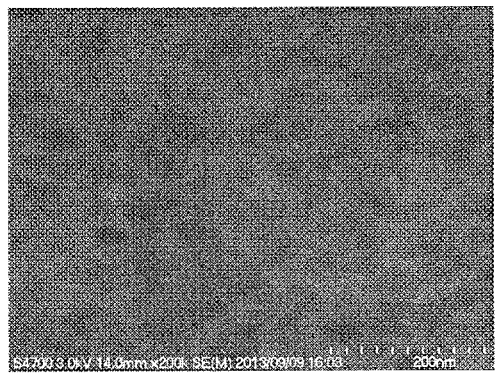
Figure 13:
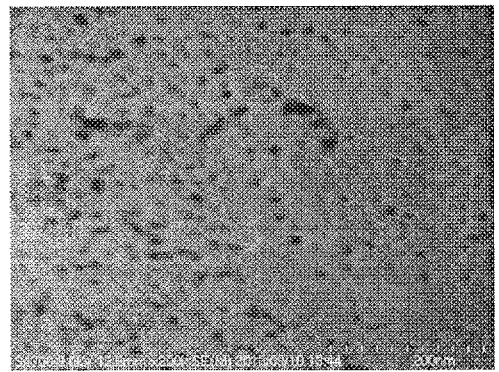

FIGS. 13(a) to 13(d) show SEM images of surfaces of samples with different durations of etching that was performed using a phosphoric acid after anodization performed with the use of a sulfuric acid under the above-described conditions (10000 magnifications; the full scale in the SEM image: 200 nm). FIG. 13(a) shows a SEM image of a sample where the etching duration was 12 minutes. FIG. 13(b) shows a SEM image of a sample where the etching duration was 10 minutes. FIG. 13(c) shows a SEM image of a sample where the etching duration was 5 minutes. FIG. 13(d) shows a SEM image of a sample where the etching duration was 3 minutes. The oxide film was removed from all the samples except for the sample where the etching duration was 3 minutes (see FIG. 13(d)). Note that, however, in the sample of the 5 minutes etching, unevenness was perceived by visual observation in some cases. Therefore, it is preferred that the etching duration is not less than 10 minutes.

The duration of the frosting treatment that is performed after the above-described anodization and etching as pretreatments are performed on an aluminum base (JIS A6063) that is mirror-finished by bit cutting without cold drawing was examined. The state of the surface of the aluminum base varies depending on whether or not the pretreatments are performed, and therefore, there is a probability that the preferred duration of the frosting treatment is different.

Figure 14:
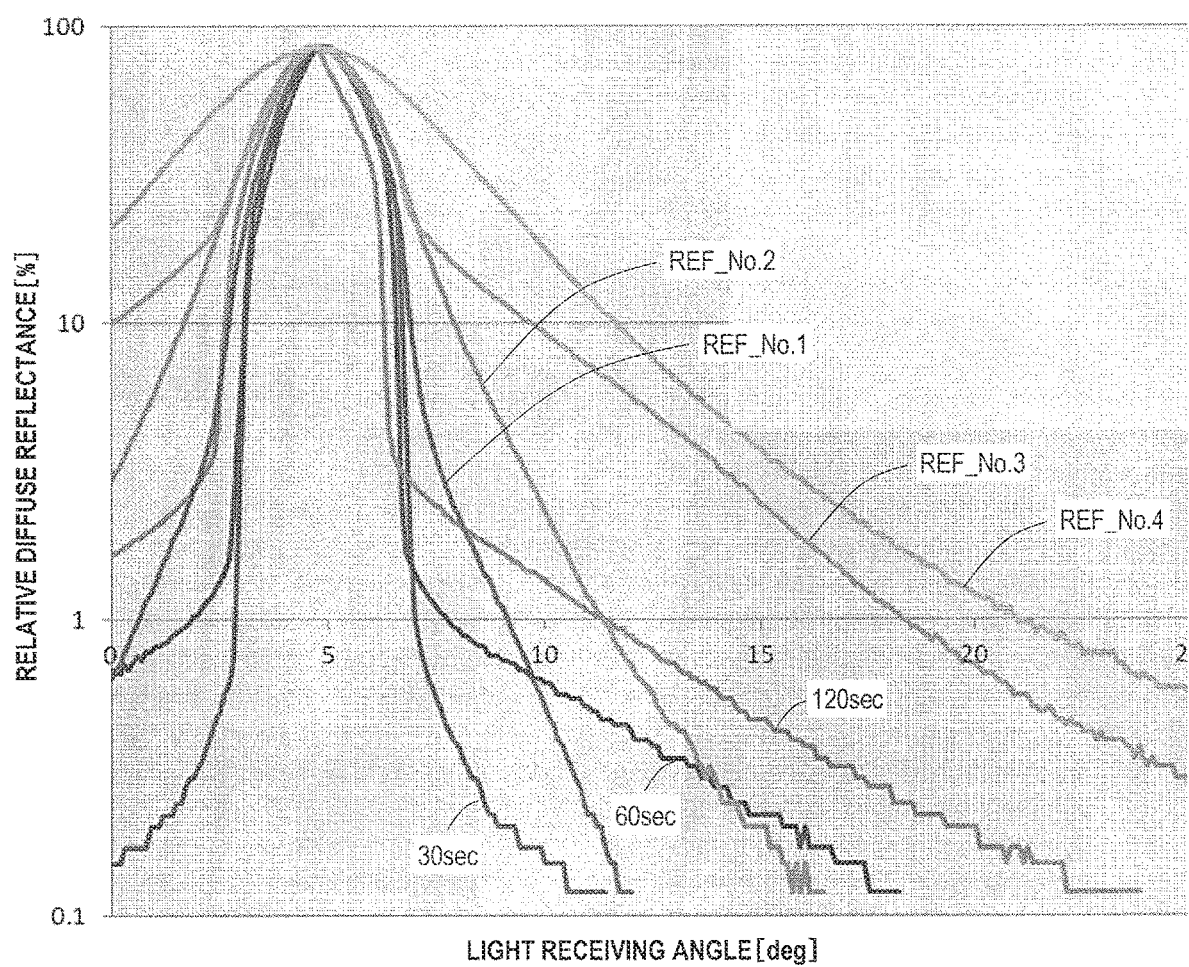
FIG. 14 A graph showing the light distribution of diffuse reflected light from films produced using, as the mold, aluminum bases which received a frosting treatment for different durations after anodization (sulfuric aqueous solution) and etching were performed as pretreatments for the frosting treatment.

As described above, after the anodization and the etching, the frosting treatment was performed with an aqueous solution containing ammonium hydrogen fluoride (concentration: 4 mass %, temperature: 20° C.) for the treatment durations of 30 seconds, 60 seconds, 120 seconds. Resultant mold bases were used to produce sample films. The results of evaluation of the light distribution characteristics which was carried out in the same way as that previously described with reference to FIG. 8(b) are shown in FIG. 14. FIG. 14 also shows the light distribution curve as does FIG. 8(a), where the incidence angle 5°, the horizontal axis represents the light receiving angle, and the vertical axis represents the common logarithm of the relative diffuse reflectance (%) which is normalized with the maximum of the diffuse reflected light intensity being 80%.

As seer from FIG. 14, the light distribution of the sample film where the duration of the frosting treatment was seconds is narrower than that of REF_No. 1 and does not have a sufficient antiglare function. The light distributions of the samples where the duration of the frosting treatment were 60 seconds and 120 seconds have such characteristics that a point at which the slope of the light distribution curve discontinuously varies is present within a range of the light receiving angles of not less than 0° and not more than 10° and the relative diffuse reflectance (%) is within the range of not less than 1% and not more than 10%.

Thus, the duration of the frosting treatment which is performed after the above-described anodization and etching as pretreatments are performed on a mold base manufactured using an aluminum base which is mirror-finished by bit cutting without cold drawing is preferably not less than 60 seconds when the aqueous solution containing ammonium hydrogen fluoride (concentration: 4 mass %, temperature: 20° C.) is used.

Figure 15:
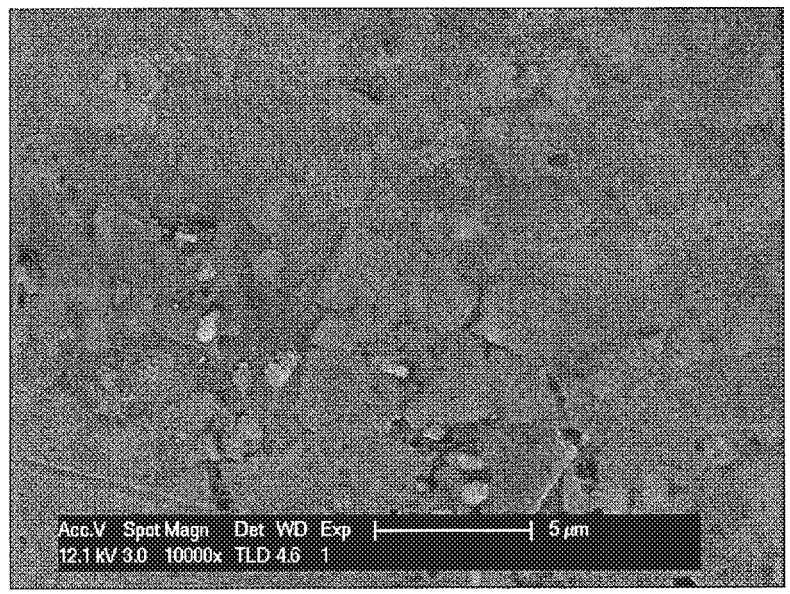
FIG. 15 (a) is a SEM image of a surface after a frosting treatment was performed for 37 seconds on an aluminum base of a mold base which was manufactured using a cold drawn aluminum base. (b) is a SEM image of a surface after anodization (sulfuric aqueous solution) and etching were performed as pretreatments and then a frosting treatment was performed for 120 seconds on an aluminum base of a mold base which was manufactured using an aluminum base which was not cold drawn.
Figure 15:
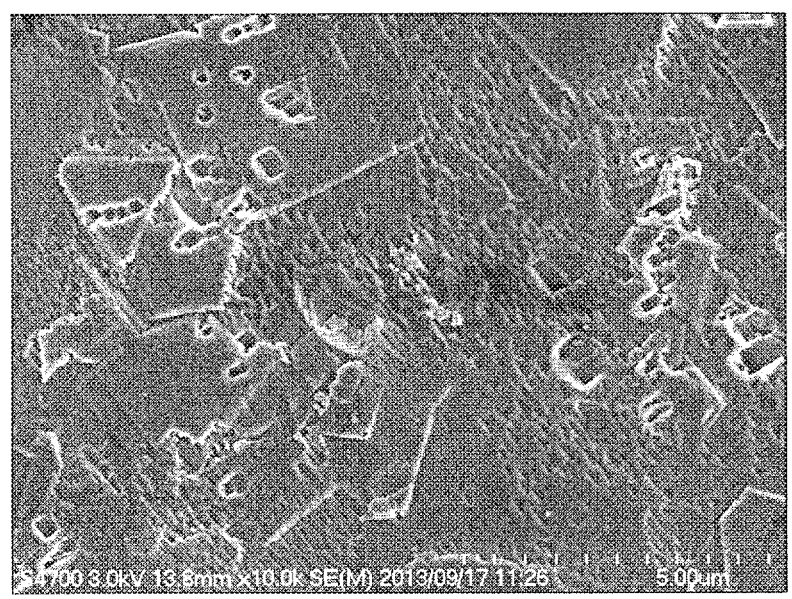

FIG. 15(a) shows a SEM image of a surface obtained by performing the frosting treatment for 37 seconds on an aluminum base which was mirror-finished by bit cutting after cold drawing (see FIG. 10A). FIG. 15(b) shows a SEM image of a surface obtained by performing the frosting treatment for 120 seconds after the anodization and etching were performed as pretreatments on an aluminum base which was formed by porthole extrusion and mirror-finished by bit cutting without cold drawing (see FIG. 14). In each of the SEM images, the magnification is 10000, and the full scale in the SEM image is 5 μm.

As seen from FIGS. 15(a) and 15(b), the two-dimensional size (area equivalent circle diameter) of any of macro raised portions formed by the frosting treatment (see the macro raised portions 18p of FIG. 1(c)) when viewed in a direction normal to the surface is not less than about 1 μm and not more than 5 μm. The average two-dimensional size of the macro raised portions is slightly smaller than the average adjoining distance of the macro recessed portions ($AD_{int}$, see FIG. 1(b)).

These aluminum bases were used to manufacture moth-eye molds in the same way as that described above. The moth-eye molds were used to produce sample films as described above with reference to FIG. 5. The resultant antireflection films which had an antiglare function were attached to the viewer side surface of a liquid crystal display panel (diagonally 4.97 inches, dot pitch (Px in FIG. 16) was 19.1 μm, pixel pitch was about 57.3 μm, about 440 ppi) and evaluated by visual observation. It was found that glare at the display surface was suppressed and blur in images was suppressed.

[Step of Etching Surface of Aluminum Base]

The results of an examination as to the step of etching the surface of the aluminum base (sometimes referred to as "base surface etching step") with the use of the alkaline etchant as a pretreatment for the frosting treatment are described below.

When the frosting treatment was performed on an aluminum base mirror-finished by bit cutting, cutting scars were formed in the surface of the aluminum base in some cases. These cutting scars can be estimated to be unevenness in the etching, which was attributed to a damaged layer formed over the surface of the aluminum base by mirror finishing by means of bit cutting. When an antireflection film produced with the use of a mold which had cutting scars was attached to a liquid crystal display panel, moiré fringes occurred in some cases. It is estimated that the moiré fringes occurred due to mutual interference of stripes of cutting scars transferred to the antireflection film and periodical structures arranged with the dot pitch (Px in FIG. 16) or pixel pitch of the liquid crystal display panel (e.g., pixel columns).

As a result of various researches, it was found that cutting scars can be reduced by etching the surface of the aluminum base with an alkaline etchant before the frosting treatment is performed with an aqueous solution containing the salt of hydrogen fluoride and ammonium.

As illustrated in Table 2 below, the base surface etching step was performed with varying conditions before the frosting treatment. In Examples 1 to 3 and Reference Examples 1 to 4, a mold base used was produced using an aluminum base (JIS A6063) which was mirror-finished by bit cutting after cold drawing.

TABLE 2

| SAMPLE NAME | BASE SURFACE ETCHING STEP | | | | FROSTING TREATMENT | |
|---|---|---|---|---|---|---|
| | ETCHANT | pH | DURATION | TEMPERATURE | DURATION | TEMPERATURE |
| EXAMPLE 1 | E1 | 10.3 | 120 min | 40° C. | 5 min | 10° C. |
| EXAMPLE 2 | E2 | 9.92 | 30 min | 40° C. | 5 min | 10° C. |
| EXAMPLE 3 | E3 | 11.7 | 30 min | 40° C. | 5 min | 10° C. |

TABLE 2-continued

| SAMPLE NAME | BASE SURFACE ETCHING STEP | | | | FROSTING TREATMENT | |
|---|---|---|---|---|---|---|
| | ETCHANT | pH | DURATION | TEMPERATURE | DURATION | TEMPERATURE |
| REFERENCE EXAMPLE 1 | E1 | 10.3 | 120 min | 40° C. | NONE | — |
| REFERENCE EXAMPLE 2 | E2 | 9.92 | 45 min | 40° C. | NONE | — |
| REFERENCE EXAMPLE 3 | E3 | 11.7 | 30 min | 40° C. | NONE | — |
| REFERENCE EXAMPLE 4 | E4 | 10.38 | 30 min | 40° C. | 5 min | 10° C. |

Alkaline etchant E1 used in Example 1 was an aqueous solution in which the concentration of an organic alkaline detergent (LC-2 manufactured by YOKOHAMA OILS & FATS INDUSTRY CO. LTD.) was 8 mass %. LC-2 manufactured by YOKOHAMA OILS & FATS INDUSTRY CO. LTD. contains the following constituents: 2-aminoethanol (12 mass %), chelating agent (2 mass % to 6 mass %), surfactant (2 mass % to 6 mass %). Therefore, the concentration of 2-aminoethanol in alkaline etchant E1 was 0.96 mass %. The pH of alkaline etchant E1 was 10.3.

The oH of the alkaline etchants was measured using a handheld pH meter (product name: D-25, manufactured by HOBIBA). Since the alkaline etchant contains a chelating agent, other metals and impurities contained in the aluminum base which are dissolved out of the aluminum base by etching are prevented from attaching to the surface of the aluminum base. Since the alkaline etchant contains a surfactant, etching of the base surface can be performed more uniformly.

Alkaline etchant E3 used in Example 3 was an aqueous solution in which the concentration of an inorganic alkaline detergent (L.G.L manufactured by YOKOHAMA. OILS & FATS INDUSTRY CO. LTD.) was 3 mass %. L.G.L manufactured by YOKOHAMA OILS & FATS INDUSTRY CO. LTD. contains the following constituents: potassium hydroxide (1 mass % to 3 mass %), chelating agent (5 mass % to 15 mass %), surfactant (5 mass % to 15 mass %). Therefore, the concentration of potassium hydroxide in alkaline etchant E3 was 0.03 mass % to 0.09 mass %. The pH of alkaline etchant E3 was 11.7.

Alkaline etchant E2 used in Example 2 was obtained by keeping alkaline etchant E3 in contact with air for one month or longer. The alkalinity of alkaline etchant E2 was weaker than that of alkaline etchant E3. The pH of alkaline etchant E2 was 9.92.

In each of Examples 1 to 3, the sample was immersed in the alkaline etchant (40°) for a predetermined time period and thereafter water-washed by immersion in pure water.

After the water washing, a frosting treatment was performed before the sample was thoroughly dried up. In the frosting treatment, an aqueous solution containing ammonium hydrogen fluoride (concentration: 4 mass %, temperature: 10° C.) was used. The duration of the frosting treatment was 5 minutes.

In Reference Examples 1 to 3, the frosting treatment was not performed after the base surface etching step. In Reference Examples 1 to 3, the base surface etching step was performed using the same etchants as alkaline etchants E1 to 53 used in Examples 1 to 3, respectively.

Alkaline etchant E4 used in Reference Example 4 was an aqueous solution in which the concentration of an inorganic alkaline detergent. (L.G.L manufactured by YOKOHAMA OILS & FATS INDUSTRY CO. LTD.) was 0.10 mass %. Therefore, the concentration of potassium hydroxide in alkaline etchant E4 was 0.001 mass % to 0.003 mass %. Alkaline etchant E4 was prepared using the same inorganic alkaline detergent as that used in alkaline etchant E3, although the concentration of the inorganic alkaline detergent was different. The pH of alkaline etchant E4 was 10.38. In Reference Example 4, the frosting treatment was performed after the base surface etching step as in Examples 1 to 3.

In each of Examples 1 to 3 and Reference Examples 1 to 4, an antiglare film was produced using as a mold an aluminum base which received the base surface etching step and the frosting treatment (or the base surface etching step). The antiglare film was formed by applying a mold releasing agent OPTOOL DSX manufactured by DATKIN INDUSTRIES, LTD) to the surface of the aluminum base, applying an acrylic UV-curable resin, transferring the UV-curable resin to a TAO film, and exposing the transferred resin on the TAO film to UV light so that the resin was cured.

The results of evaluation of the antiglare function with the use of the aluminum bases and the antiglare films (sample films) produced by the aluminum bases are shown in Table 3.

TABLE 3

| SAMPLE NAME | HAZE VALUE | Ra (nm) | MOIRÉ | UNEVENNESS | PATTERN | ANTI-GLARE PROPERTY | WHITISH |
|---|---|---|---|---|---|---|---|
| EXAMPLE 1 | 10.21 | 95.93 | ◯ | ◯ | ◯ | ◯ | ◯ |
| EXAMPLE 2 | 22.87 | 202.2 | ◯ | ◯ | ◯ | ◯ | ◯ |
| EXAMPLE 3 | 28.16 | 243.2 | ◯ | ◯ | ◯ | ◯ | Δ |
| REFERENCE EXAMPLE 1 | 9.99 | 78.51 | ◯ | ◯ | ◯ | X | ◯ |
| REFERENCE EXAMPLE 2 | 4.87 | 41.49 | ◯ | ◯ | ◯ | X | ◯ |

TABLE 3-continued

| SAMPLE NAME | HAZE VALUE | Ra (nm) | MOIRÉ | UNEVENNESS | PATTERN | ANTI-GLARE PROPERTY | WHITISH |
|---|---|---|---|---|---|---|---|
| REFERENCE EXAMPLE 3 | 21.84 | 352.76 | ○ | ○ | X | ○ | ○ |
| REFERENCE EXAMPLE 4 | — | — | — | X | — | — | — |

In Table 3, the columns of "Ra", "UNEVENNESS", and "PATTERN" show the results of evaluation of the aluminum bases, and the columns of "HAZE VALUE", "MOIRÉ", "ANTIGLARE PROPERTY", and "WHITISH" show the results of evaluation of the antiglare films. The values of "HAZE VALUE" and "Ra" are measurement results. "MOIRÉ", "UNEVENNESS", "PATTERN", "ANTIGLARE PROPERTY", and "WETTISH" are subjective evaluation by visual observation. The respective particulars are described below.

In Table 3, the column of "Ra" shows the results of measurement of the arithmetic mean roughness Ra of the surface of the aluminum bases. The arithmetic mean roughness Ra was measured using an optical profiling system (Wyko NT1100) manufactured by Veeco. It is preferred that the base surface etching step and the frosting treatment make the arithmetic mean roughness Ra of the surface of the aluminum base be, for example, not less than 50 nm and not more than 300 nm.

In Table 3, the column of "UNEVENNESS" shows the results of evaluation by visual observation as to whether or not the surface of the aluminum base has unevenness. It was evaluated whether or not the frosting treatment of the surface of the aluminum base was uniformly performed. In the column of "UNEVENNESS" of Table 3, "○" represents that no unevenness was found, and "×" represents that unevenness was found. In Reference Example 4, the damaged layer was not sufficiently removed probably because the concentration of the base contained in the alkaline etchant used in the base surface etching step was low. As will be described later, when no unevenness was found (the frosting treatment was uniformly performed), a portion of about 1.4 μm from the surface of the aluminum base was removed. In Reference Example 4, the frosting treatment was not uniformly performed so that unevenness occurred probably because the thickness of a portion of the aluminum base which was etched away in the base surface etching step was small.

Possible reasons that unevenness occurred in Reference Example 4 are as follows. Although alkaline etchant E4 used in Reference Example 4 was prepared using the same inorganic alkaline detergent as that used for alkaline etchant E1 of Example 3, the concentration of the inorganic alkaline detergent was lower in alkaline etchant E4. Therefore, it was estimated that in Reference Example 4 the concentration of the base contained in the alkaline etchant was low so that the effect of etching the surface of the aluminum base was small as compared with Example 3. In Reference Example 4, the concentration of the chelating agent contained in the alkaline etchant was also low. However, when the amount of other metals and impurities contained in the aluminum base is in a certain range, the function of adsorbing or sequestering ions of these metals and impurities sometimes does not decrease so much as compared with the case of Example 3. In such a case, it is estimated that, due to the function of the chelating agent, nonuniformity in the etching of the surface of the aluminum base with the alkaline etchant can be increased. It is estimated that this led to increase of nonuniformity in the frosting treatment, and as a result, unevenness occurred.

It is preferred that the concentration of the base contained in the alkaline etchant is, for example, not less than 0.01 mass %. It is preferred that the concentration of the inorganic base contained in the alkaline etchant is, for example, not less than 0.03 mass %. It is preferred that the concentration of the organic base contained in the alkaline etchant is, for example, not less than 0.96 mass %.

In Table 3, the column of "PATTERN" shows the results of evaluation by visual observation as to whether or not the surface of the aluminum base has a pattern was the "pattern" refers to an uneven structure whose size is, for example, several hundred times to several thousand times the size of the antiglare structure. In the column of "PATTERN" of Table 3, "○" represents that no pattern was found, and "×" represents that a pattern was found. In the surface of the aluminum base of Reference Example 3, an uneven structure in the order of about 1 mm was found. Due to this pattern (uneven structure) in the surface of the aluminum base, the pattern was conspicuous when the antiglare film was attached to a surface of a black acrylic plate. This pattern has a size which is several hundred times to several thousand times the size of the antiglare structure and therefore does net have an antiglare function.

This pattern (uneven structure) in the surface of the aluminum base was produced probably because, for example, the pH of alkaline etchant E3 used in Reference Example 3 was 11.7, i.e., had strong alkalinity. It is estimated that, due to the base of strong alkalinity, the surface of the aluminum base was excessively roughened so that the pattern was produced. In the base surface etching step, the probability of occurrence of a concentration gradient in the alkaline etchant is one of the possible causes of occurrence of a pattern. Alternatively, it can be estimated that the pattern in the surface of the aluminum base is attributed to a damaged layer formed in the surface of the aluminum base by mirror finishing by means of bit cutting. Not only a damaged layer but also, for example, nonuniformity in composition of the aluminum base can be a cause of occurrence the pattern.

No pattern was found in the surface of the aluminum base of Example 3. It is estimated that, due to the frosting treatment which was performed with an aqueous solution containing ammonium hydrogen fluoride after the base surface etching step, the damaged layer at the surface the aluminum base was partially removed and/or the pattern in the surface of the aluminum base became less conspicuous.

In Table 3, the column of "HAZE VALUE" shows the results of measurement of the haze value of antiglare films. The haze value was calculated from the formula of (diffuse transmittance/total transmittance)×100 using a haze meter NDH2000 manufactured by NIPPON DENSHOKU INDUSTRIES CO., LTD.

In Table 3, the column of "MOIRÉ" shows the results of evaluation by visual observation as to whether or not moiré fringes occur with the antiglare films attached to a surface of a display panel of a liquid crystal television set (AQUOS UD1 manufactured by Sharp Corporation). In the column of "MOIRÉ" of Table 3, "◯" represents that no moiré fringes occurred.

In Table 3, the column of "ANTIGLARE PROPERTY" shows the results of determination as to whether or not the antiglare films have an antiglare property by visual observation of reflection of a fluorescent lamp with the antiglare films attached to a surface of a black acrylic plate. In the column of "ANTIGLARE PROPERTY" of Table 3, "◯" represents that it was determined that the film had an antiglare property, and "×" represents that it was determined that the film had no antiglare property. In general, an antiglare film of a large haze value has an excellent antiglare function and an excellent antiglare property.

In Table 3, the column of "WHITISH" shows the results of a hearing about whether or not viewers noticed that images viewed through the antiglare films with the antiglare films attached to a surface of a display panel of a liquid crystal television set (QUOS UD1 manufactured by Sharp Corporation) appeared whitish. The hearing was conducted on five people. In the column of "WHITISH" of Table 3, "◯" represents that zero out of five people answered that he/she "noticed that the images appeared whitish", and "Δ" represents that not less than one and not more than three out of five people answered that he/she "noticed that the images appeared whitish". In general, in the case of an antiglare film which has a large haze value, an image viewed through the film is likely to appear whitish due to the antiglare function of the film.

It is expected that, among the above, the evaluations "ANTIGLARE PROPERTY" and "WHITISH" vary depending on a degree of the antiglare function an evaluator wants to realize. For example, the above-described evaluations of Table 3 are based on the condition that the antiglare function is determined to be appropriate when the haze value is not less than about 7 and not more than about 24. The mold manufactured according to the mold manufacturing method according to an embodiment of the present invention is not limited to illustrated examples but can be used for production of an antireflection film which has a higher antiglare function (a larger haze value (e.g., not less than about 7 and not more than about 28)). As a matter of course, the mold can also be used for production of an antireflection film which has a lower antiglare function (a smaller haze value (e.g., not less than about 1 and not more than about 5)).

In the base surface etching step, a portion of about 1.4 μm, for example, was removed from the surface of the aluminum base. The thickness of the portion which is to be etched away in the base surface etching step can be appropriately adjusted by adjusting, for example, the etching duration, the temperature of the etchant, or the like. The preferred thickness of the portion which is to be etched away in the base surface etching step varies depending on, for example, the state of the surface of the aluminum base. The thickness of the portion which is to be etched away is not limited to the above example. It is preferred that the etching is performed to an extent that the damaged layer at the surface of the aluminum base is sufficiently removed.

As seen from the above-described experimental examples, from the viewpoint of obtaining an antireflection film which has an appropriate antiglare function (e.g., the haze value is not less than about 7 and not more than about 24), it is preferred that the pH of the alkaline etchant used in the base surface etching step is, for example, not less than 10 and not more than 12. If the pH of the alkaline etchant is not more than 9, there is a probability that the damaged layer at the surface of the aluminum base cannot be sufficiently removed. If the pH of the alkaline etchant is not less than 13, there is a probability that the surface of the aluminum base is excessively roughened and/or it can be a cause of unevenness.

The preferred range of the pH of the alkaline etchant used in the base surface etching step can vary depending on the state of the surface of the aluminum base. The state of the surface of the aluminum base can vary depending on, for example, the type, manufacturing method and/or processing method of the aluminum base.

The thus-obtained aluminum base by the frosting treatment in the shape of a hollow cylinder is used to form an inverted moth-eye structure as described above, whereby a moth-eye mold which is capable of providing an antireflection function and an antiglare function is obtained. When a moth-eye mold in the shape of a hollow cylinder is used, an antireflection film can be produced according to a roll-to-roll method as described above. In this case, in order to improve the adhesion between a film base (TAG film or PET film) which is for production of an antireflection film and the antireflection film, the following steps are preferably performed.

A UV-curable resin containing a solvent (e.g., acrylic resin) is applied over a TAG film (to a thickness of, for example, 2 μm to 20 μm). The solvent selected herein is a solvent which is capable of dissolving the surface of the TAC film (e.g., ketone solvent). When the solvent dissolves the surface of the TAG film, a region is formed in which TAG and the UV-curable resin are mixed.

Thereafter, the solvent is removed, and the TAG film is wound around the outer perimeter surface of the moth-eye mold such that the UV-curable resin adheres to the surface.

Then, the UV-curable resin is irradiated with ultraviolet light so as to be cured. Here, the temperature of the UV-curable resin is kept in the range from 30° C. to 70° C.

Thereafter, the TAG film is peeled off from the moth-eye mold. When necessary, the resin is again irradiated with ultraviolet light.

When a hard coat layer is formed on the TAC film, a material of the hard coat layer may contain solvent which is capable of dissolving the surface of the TAG film. In this case, the UV-curable resin for production of an antireflection film does not need to contain the solvent.

When a PET film is used, it is preferred that a layer of an aqueous primer, e.g., a polyester or acrylic resin, (thickness: 2 μm to 20 μm) is formed before application of the UV-curable resin. Also in this case, the UV-curable resin for production of an antireflection film does not need to contain the solvent.

INDUSTRIAL APPLICABILITY

A mold manufacturing method according to the present invention is used for manufacture of a mold which is suitably used for production of an antireflection film (antireflection surface) or the like. An antireflection film according to the present invention has a surface structure which provides an appropriate antiglare function and an excellent antireflection function and is suitably used in, for example, high-definition display panels.

REFERENCE SIGNS LIST

10 mold base
12 aluminum base 14 porous alumina layer
14p micro recessed portion
16 inorganic material layer
18 aluminum film
18r aluminum remnant layer
100 moth-eye mold

The invention claimed is:

1. A mold manufacturing method, comprising the steps of:
   (a) providing an aluminum base in the shape of a hollow cylinder which is made of a Al—Mg—Si based aluminum alloy, the aluminum base being mechanically mirror-finished;
   (b) performing a frosting treatment on a surface of the aluminum base with an aqueous solution which contains a salt of hydrogen fluoride and ammonium;
   (c) after step (b), forming an inorganic material layer on the surface of the aluminum base and forming an aluminum film on the inorganic material layer, thereby forming a mold base;
   (d) after step (c), anodizing a surface of the aluminum film, thereby forming a porous alumina layer which has a plurality of micro recessed portions;
   (e) after step (d), bringing the porous alumina layer into contact with an etchant, thereby enlarging the plurality of micro recessed portions of the porous alumina layer; and
   (f) after step (e), further performing anodization to grow the plurality of micro recessed portions,
   wherein the mold manufacturing method further comprises, before step (b), a base surface etching step of etching the surface of the aluminum base using an alkaline etchant, and wherein the base surface etching step and step (b) make an arithmetic mean roughness Ra of the surface of the aluminum base be not less than 50 nm and not more than 300 nm.

2. The mold manufacturing method of claim 1, wherein the aluminum base is a cold-drawn aluminum base.

3. The mold manufacturing method of claim 1 further comprising, before step (b), a degreasing step and a water washing step.

4. The mold manufacturing method of claim 3, wherein step (b) is performed within 15 minutes after the water washing step is finished.

5. The mold manufacturing method of claim 3, wherein the base surface etching step also serves as the degreasing step.

6. The mold manufacturing method of claim 1, wherein the alkaline etchant contains an inorganic or organic base in a proportion of not less than 0.03 mass %.

7. The mold manufacturing method of claim 1, wherein a pH of the alkaline etchant is not less than 10 and not more than 12.

8. The mold manufacturing method of claim 1, wherein the alkaline etchant contains potassium hydroxide.

9. The mold manufacturing method of claim 1, wherein the alkaline etchant contains an organic compound which has an amino group.

10. The mold manufacturing method of claim 1 wherein, in the base surface etching step, a portion of at least 1.4 μm from a surface of the aluminum base is removed.

11. The mold manufacturing method of claim 1 further comprising, before step (b), an anodization step and an etching step for pretreatment.

12. The mold manufacturing method of claim 1 wherein, in step (b), the salt of hydrogen fluoride and ammonium is ammonium hydrogen fluoride.

13. A mold manufacturing method, comprising the steps of:
   (a) providing an aluminum base in the shape of a hollow cylinder which is made of a Al—Mg—Si based aluminum alloy, the aluminum base being mechanically mirror-finished;
   (b) performing a frosting treatment on a surface of the aluminum base with an aqueous solution which contains a salt of hydrogen fluoride and ammonium;
   (c) after step (b), forming an inorganic material layer on the surface of the aluminum base and forming an aluminum film on the inorganic material layer, thereby forming a mold base;
   (d) after step (c), anodizing a surface of the aluminum film, thereby forming a porous alumina layer which has a plurality of micro recessed portions;
   (e) after step (d), bringing the porous alumina layer into contact with an etchant, thereby enlarging the plurality of micro recessed portions of the porous alumina layer; and
   (f) after step (e), further performing anodization to grow the plurality of micro recessed portions,
   wherein the mold manufacturing method further comprises, before step (b), a base surface etching step of etching the surface of the aluminum base using an alkaline etchant, and
   wherein, before step (b), an anodization step and an etching step for pretreatment are performed.

14. The mold manufacturing method of claim 13, wherein the aluminum base is a cold-drawn aluminum base.

15. The mold manufacturing method of claim 13 further comprising, before step (b), a degreasing step and a water washing step.

16. The mold manufacturing method of claim 15, wherein step (b) is performed within 15 minutes after the water washing step is finished.

17. The mold manufacturing method of claim 15, wherein the base surface etching step also serves as the degreasing step.

18. The mold manufacturing method of claim 13, wherein the alkaline etchant contains an inorganic or organic base in a proportion of not less than 0.03 mass %.

19. The mold manufacturing method of claim 13, wherein a pH of the alkaline etchant is not less than 10 and not more than 12.

20. The mold manufacturing method of claim 13, wherein the alkaline etchant contains potassium hydroxide.

21. The mold manufacturing method of claim 13, wherein the alkaline etchant contains an organic compound which has an amino group.

22. The mold manufacturing method of claim 13, wherein the base surface etching step and step (b) make an arithmetic mean roughness Ra of the surface of the aluminum base be not less than 50 nm and not more than 300 nm.

23. The mold manufacturing method of claim 13 wherein, in the base surface etching step, a portion of at least 1.4 μm from a surface of the aluminum base is removed.

24. The mold manufacturing method of claim 13 wherein, in step (b), the salt of hydrogen fluoride and ammonium is ammonium hydrogen fluoride.

* * * * *